(12) United States Patent
Son et al.

(10) Patent No.: US 11,031,411 B2
(45) Date of Patent: *Jun. 8, 2021

(54) VERTICAL NON-VOLATILE MEMORY DEVICE WITH HIGH ASPECT RATIO

(71) Applicant: SAMSUNG ELECTRONICS CO., LTD., Suwon-si (KR)

(72) Inventors: Young-Hwan Son, Hwaseong-si (KR); Jae-Hoon Jang, Seongnam-si (KR); Jee-Hoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/505,266

(22) Filed: Jul. 8, 2019

(65) Prior Publication Data
US 2019/0333925 A1 Oct. 31, 2019

Related U.S. Application Data

(63) Continuation of application No. 15/639,733, filed on Jun. 30, 2017, now Pat. No. 10,396,086.

(30) Foreign Application Priority Data

Dec. 19, 2016 (KR) ........................ 10-2016-0173917

(51) Int. Cl.
*H01L 27/1157* (2017.01)
*H01L 27/11556* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ......... H01L 27/11556; H01L 27/11519; H01L 27/11565; H01L 27/11524;
(Continued)

(56) References Cited

U.S. PATENT DOCUMENTS 8,048,798 B2   11/2011   Kidoh et al.
8,343,820 B2   1/2013   Jung
(Continued)

*Primary Examiner* — Stephen M Bradley
*Assistant Examiner* — Gustavo G Ramallo
(74) *Attorney, Agent, or Firm* — Volentine, Whitt & Francos, PLLC

(57) ABSTRACT

A vertical non-volatile memory device includes a lower insulating layer on a substrate, a multilayer structure including gate electrodes and interlayer insulating layers alternately stacked on the lower insulating layer, a gate dielectric layer and a channel structure, and has an opening extending through the multilayer structure and exposing the lower insulating layer. The opening includes a first open portion extending through at least one layer of the multilayer structure at a first width, and a second open portion extending through the multilayer structure at a second width less than the first width. The gate dielectric layer lines the opening, and the channel structure is disposed on the gate dielectric layer and is electrically connected to the substrate.

19 Claims, 33 Drawing Sheets

(51) Int. Cl.
*H01L 27/11519* (2017.01)
*H01L 27/11565* (2017.01)
*H01L 27/11524* (2017.01)
*H01L 27/11529* (2017.01)
*H01L 27/11573* (2017.01)
*H01L 27/11582* (2017.01)

(52) U.S. Cl.
CPC .. *H01L 27/11524* (2013.01); *H01L 27/11529* (2013.01); *H01L 27/11565* (2013.01); *H01L 27/11573* (2013.01); *H01L 27/11582* (2013.01)

(58) Field of Classification Search
CPC ......... H01L 27/11529; H01L 27/11582; H01L 27/11573; H01L 27/1157
See application file for complete search history.

(56) References Cited

U.S. PATENT DOCUMENTS

| | | | |
|---|---|---|---|
| 8,476,713 B2 | 7/2013 | Lee et al. | |
| 8,569,827 B2 | 10/2013 | Lee et al. | |
| 9,230,980 B2 | 1/2016 | Rabkin et al. | |
| 9,230,987 B2 | 1/2016 | Pachamuthu et al. | |
| 9,343,326 B2 | 5/2016 | Kim et al. | |
| 10,396,086 B2 * | 8/2019 | Son | H01L 27/1157 |
| 2010/0120214 A1 * | 5/2010 | Park | H01L 27/11578 438/287 |
| 2010/0155810 A1 * | 6/2010 | Kim | H01L 29/792 257/316 |
| 2010/0295134 A1 * | 11/2010 | Nagashima | H01L 27/11521 257/390 |
| 2013/0134492 A1 | 5/2013 | Yang et al. | |
| 2015/0294978 A1 * | 10/2015 | Lu | H01L 21/31144 438/269 |
| 2015/0311301 A1 | 10/2015 | Seol et al. | |
| 2016/0351580 A1 * | 12/2016 | Hopkins | H01L 29/7883 |
| 2018/0108669 A1 * | 4/2018 | Zhu | H01L 27/1157 |

* cited by examiner

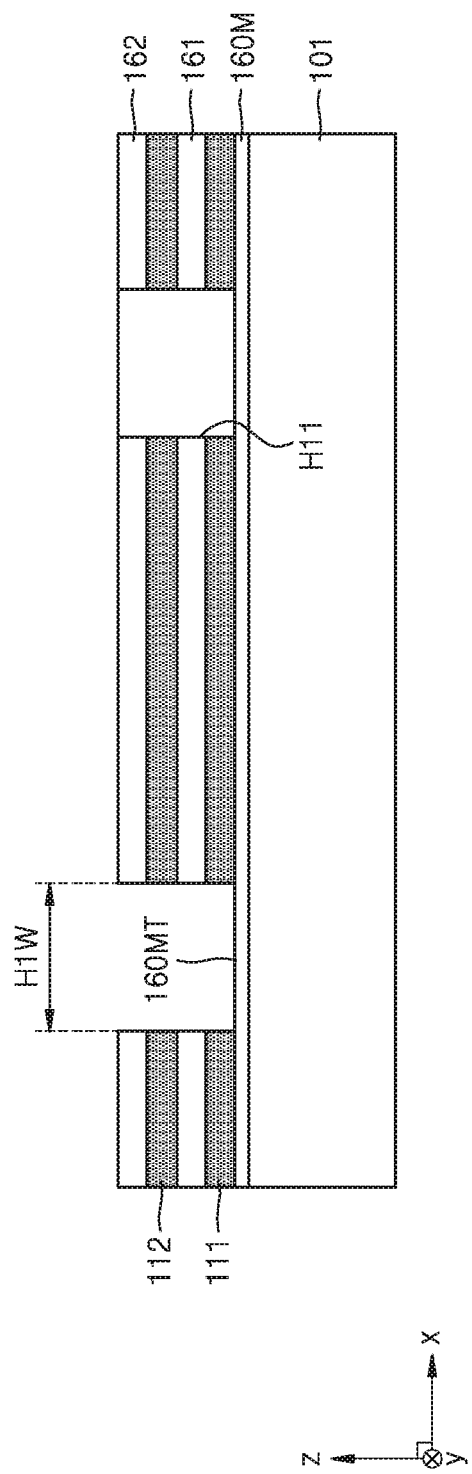

VERTICAL NON-VOLATILE MEMORY DEVICE WITH HIGH ASPECT RATIO

PRIORITY STATEMENT

This is a Continuation of U.S. application Ser. No. 15/639,733, filed Jun. 30, 2017, now U.S. Pat. No. 10,396,086 issued on Aug. 27, 2019, in which application claims the benefit of Korean Patent Application No. 10-2016-0173917, filed on Dec. 19, 2016, in the Korean Intellectual Property Office, the disclosure of which is hereby incorporated by reference in its entirety.

BACKGROUND

The inventive concept relates to a non-volatile memory device having a vertical structure and to a method of manufacturing the same.

Electronic products are required to process large amounts of data in spite of their small size. Accordingly, a non-volatile memory device having a vertical transistor structure, instead of an existing horizontal transistor structure, has been suggested to improve the degree of integration of semiconductor memory devices. Such non-volatile memory devices have vertical channels formed in channel holes that have an especially high aspect ratio. Therefore, in the manufacturing of a non-volatile memory device having a vertical transistor structure, a simple and reliable way of forming a channel hole is required.

SUMMARY

According to an aspect of the inventive concept, there is provided a non-volatile memory device including: a substrate, a lower insulating layer disposed on the substrate, a multilayer structure of layers comprising gate electrodes and interlayer insulating layers alternately stacked on the lower insulating layer, a gate dielectric, and a channel structure and in which the multi-layer structure has an opening extending vertically from the lower insulating layer, the opening includes a first open portion and a second open portion, the first open portion extends through at least one of the layers of the multilayer structure from the lower insulating layer, the second open portion is located on the first open portion and extends vertically upwardly from the first open portion in the multilayer structure, the opening has a first width at the first open portion and a second width at the second open portion, the second width being less than the first width, the gate dielectric extends along an inner surface and a lower surface defining a side and a bottom and of the opening, respectively, the channel structure is disposed on the gate dielectric layer within the opening as extending along the inner surface and a lower surface defining the side and the bottom of the opening, and the channel structure extends through the lower insulating layer and electrically connected to the substrate.

According to another aspect of the inventive concept, there is provided a non-volatile memory device including: a substrate, a lower insulating layer disposed on the substrate, at least one gate electrode and at least one first interlayer insulating layer stacked one on another on the lower insulating layer, second gate electrodes and second interlayer insulating layers that are alternately stacked on the at least one first interlayer insulating layer, a gate dielectric layer and a channel structure, and in which the device has an opening extending therein, the opening includes a first open portion extending through the at least one gate electrode and the at least one first interlayer insulating layer, and a second open portion extending through the second gate electrodes and the second interlayer insulating layers, the second open portion has a width less than a width of the first open portion, the gate dielectric layer extends along an inner surface and a lower surface defining a side and a bottom of the opening, respectively, and the channel structure is disposed on the gate dielectric layer and on the inner surface and the lower surface defining the side and the bottom of the opening, and the channel structure extends through the lower insulating layer and electrically connected to the substrate.

According to another aspect of the inventive concept, there is provided a non-volatile memory device including: a substrate having a main surface, a lower insulating layer disposed on the main surface of the substrate, a lower stack of layers disposed on the lower insulating layer, the lower stack of layers including a lower gate electrode and a lower insulating layer disposed on the lower gate electrode, an upper stack of layers disposed on the lower stack of layers, the upper stack of layers including upper gate electrodes and upper interlayer insulating layers, the upper interlayer insulating layers being alternately disposed in a vertical direction with the upper gate electrodes, and the upper stack of layers having an uppermost surface, and a columnar structure having a first section extending vertically through the lower stack of layers and a second section extending vertically through the upper stack of layers from the second section to the upper surface of the upper stack of layers. The first section of the columnar structure contacts the layers of the lower stack and has a cross section in a vertical plane extending perpendicular to the main surface of the substrate. The second section of the columnar structure contacts the layers of the upper stack and has a cross section in said vertical plane. The columnar structure includes a gate dielectric facing the layers of the lower stack and the layers of the upper stack, and a vertical channel extending through the lower insulating layer, the gate dielectric being interposed between the vertical channel and the gate electrode layers of the lower and upper stacks. Also, a width of the first section of the columnar structure in said vertical plane is greater than a width of the second section of the columnar structure in said vertical plane, at location even in height above the substrate with an interface between the lower stack of layers and the upper stack of layers.

BRIEF DESCRIPTION OF THE DRAWINGS

The inventive concept will be more clearly understood from the following detailed description of examples thereof taken in conjunction with the accompanying drawings in which:

FIGS. 9A, 9B, 9C, 9D, 9E, 9F, 9G, 9H, 9I, 9J, 9K, 9L, 9M, 9N, 9O 9P and 9Q are cross-sectional views of a non-volatile memory device during the course of its manufacture, and together illustrate an example of a method of manufacturing a non-volatile memory device according to other the inventive concept;

DETAILED DESCRIPTION

Figure 1:
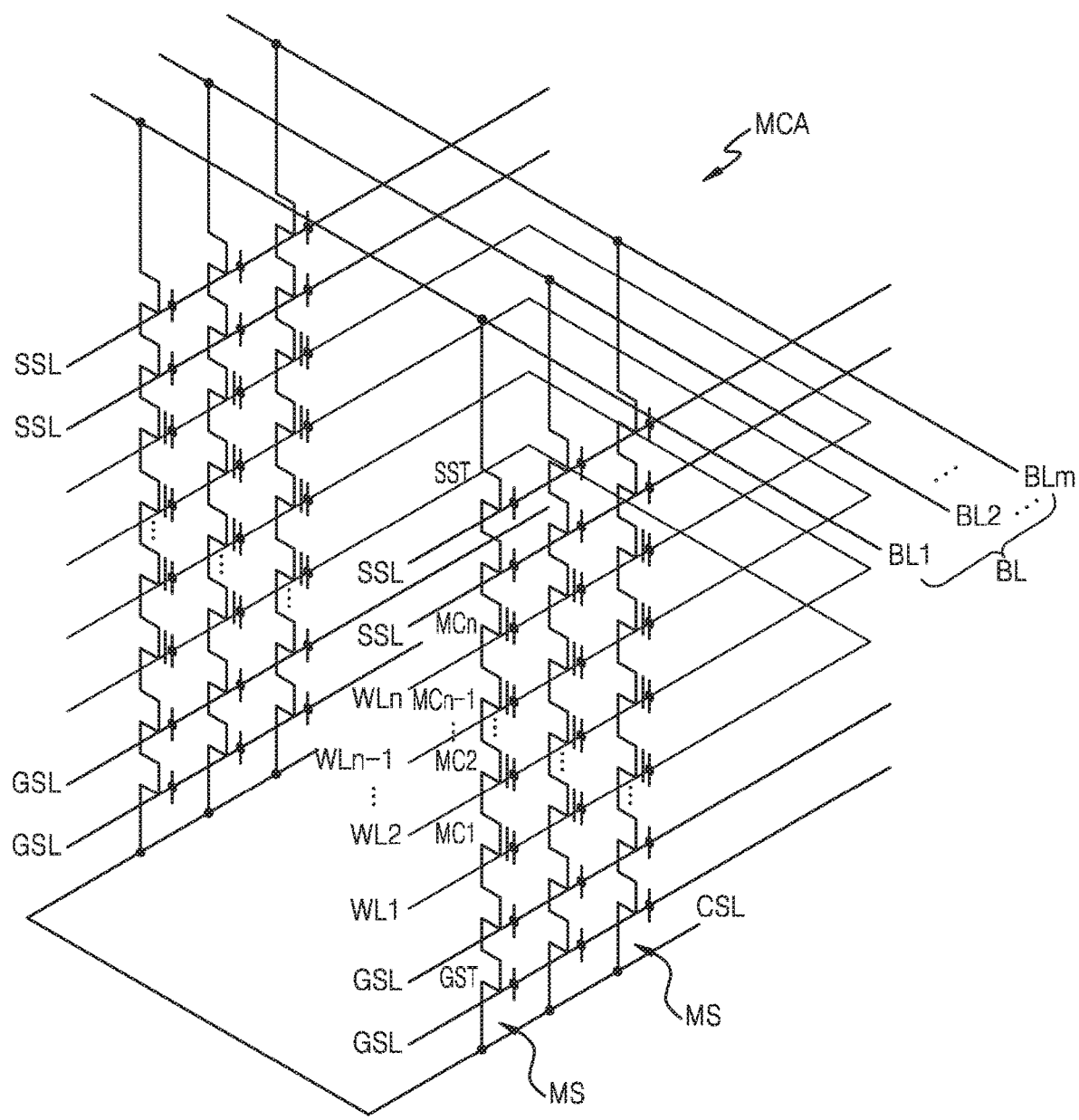
FIG. 1 is an equivalent circuit diagram of a memory cell array of a non-volatile memory device having a vertical structure, according to the inventive concept.

FIG. 1 is an equivalent circuit diagram of a memory cell array MCA of a non-volatile memory device 10 having a vertical structure, according to the inventive concept. FIG. 1 is an equivalent circuit diagram of a NAND flash memory device having a vertical channel structure.

Referring to FIG. 1, the memory cell array MCA may include memory cell strings MS. The memory cell array MCA includes bit lines BL (e.g., bit lines BL1, BL2, . . . , BLm), word lines WL (e.g., word lines WL1, WL2, . . . , WLn−1, and WLn), at least one string selection line SSL, at least one ground selection line GSL, and a common source line CSL. The memory cell strings MS are between the bit lines BL (e.g., the bit lines BL1, BL2, . . . , BLm) and the common source line CSL.

The memory cell strings MS may each include a string selection transistor SST, a ground selection transistor GST, and memory cell transistors MC1, MC2, . . . , MCn−1, and MCn. A drain region of the string selection transistor SST is connected to the bit lines (e.g., the bit lines BL1, BL2, . . . , BLm), and a source region of the ground selection transistor GST is connected to the common source line CSL. The common source line CSL is a region where source regions of the ground selection transistors GST are connected.

The string selection transistor SST may be connected to the string selection line SSL, and the ground selection transistor GST may be connected to the ground selection line GSL. Also, the memory cell transistors MC1, MC2, . . . , MCn−1, and MCn may be respectively connected to the word lines WL (e.g., word lines WL1, WL2, . . . , WLn−1, and WLn).

The memory cell array MCA may be three-dimensionally arranged. The memory cell transistors MC1, MC2, . . . , MCn−1, and MCn that form the memory cell strings MS may have structures in which the memory cell transistors MC1, MC2, . . . , MCn−1, and MCn are connected to one another in series with respect to a main surface of a substrate 101 (refer to FIGS. 2A to 11D). Accordingly, channel structures 130, 230, and 330 (refer to FIGS. 2A to 11D) of the string selection transistor SST, the ground selection transistor GST, and the memory cell transistors MC1, MC2, . . . , MCn−1, and MCn may extend in a direction substantially perpendicular to the main surface of the substrate 101.

Figure 2A:
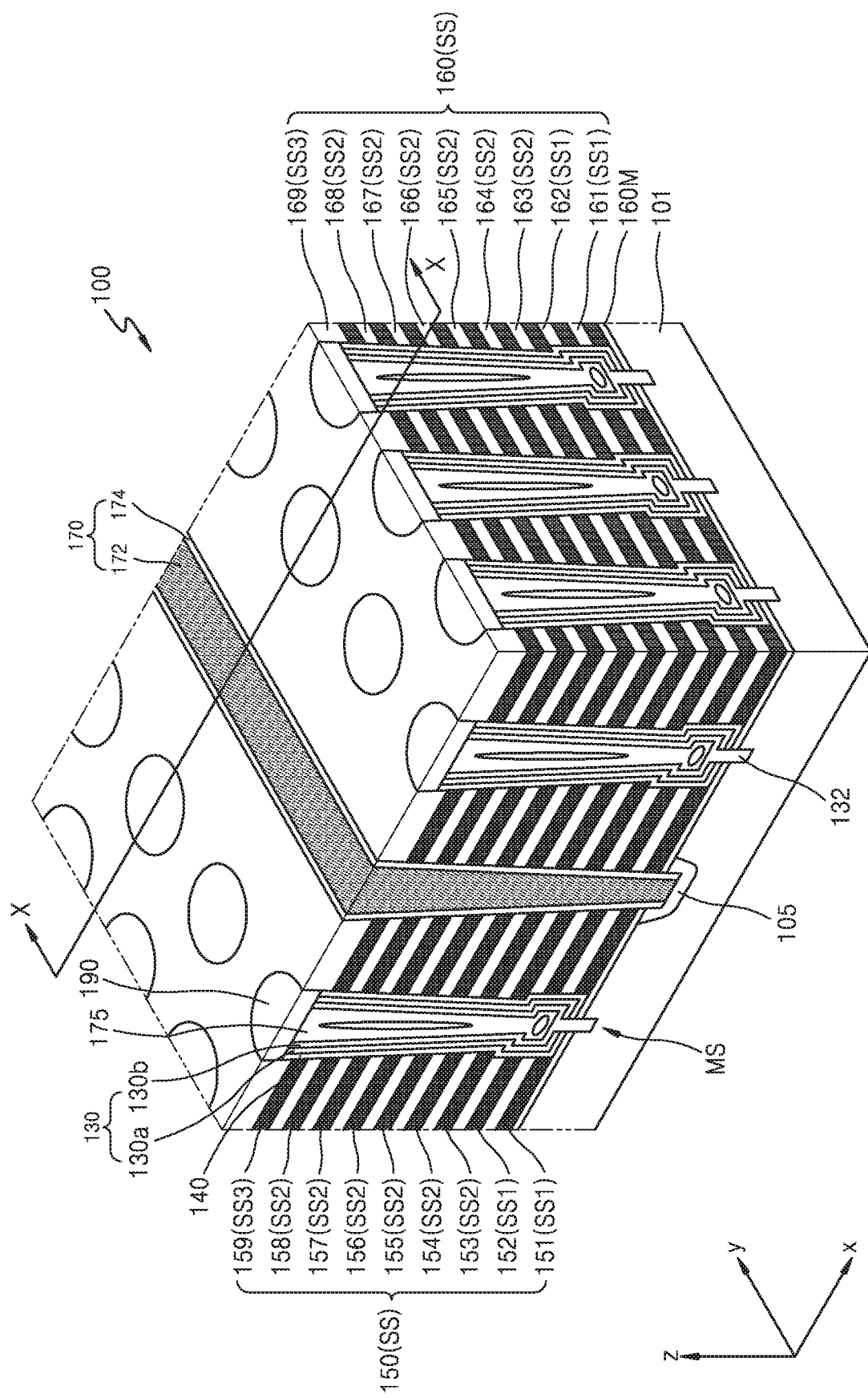
FIG. 2A is a perspective view of an example of a non-volatile memory device having a vertical structure, according to the inventive concept.
Figure 2B:
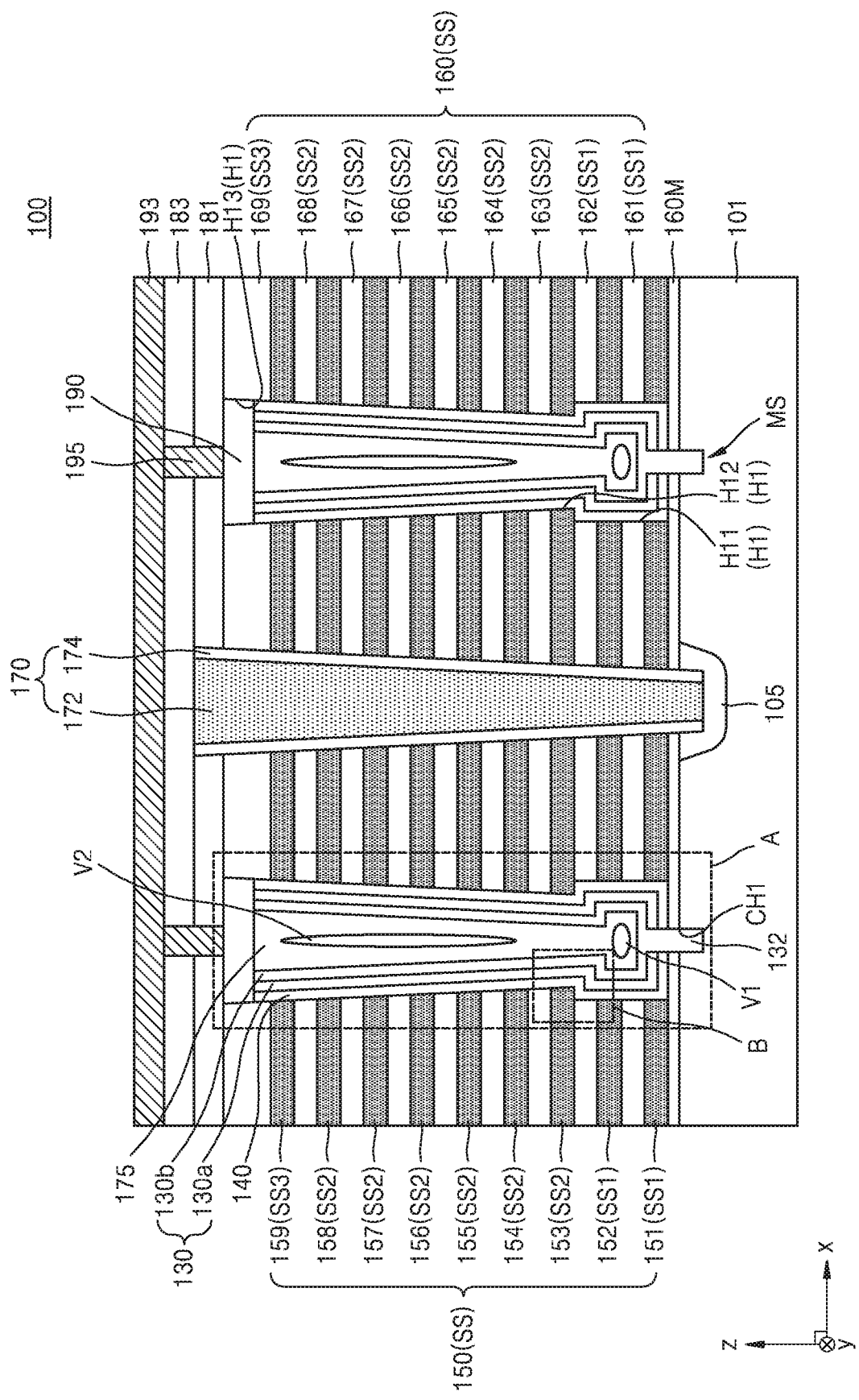
FIG. 2B is a cross-sectional view taken along line X-X of FIG. 2A.
Figure 3A:
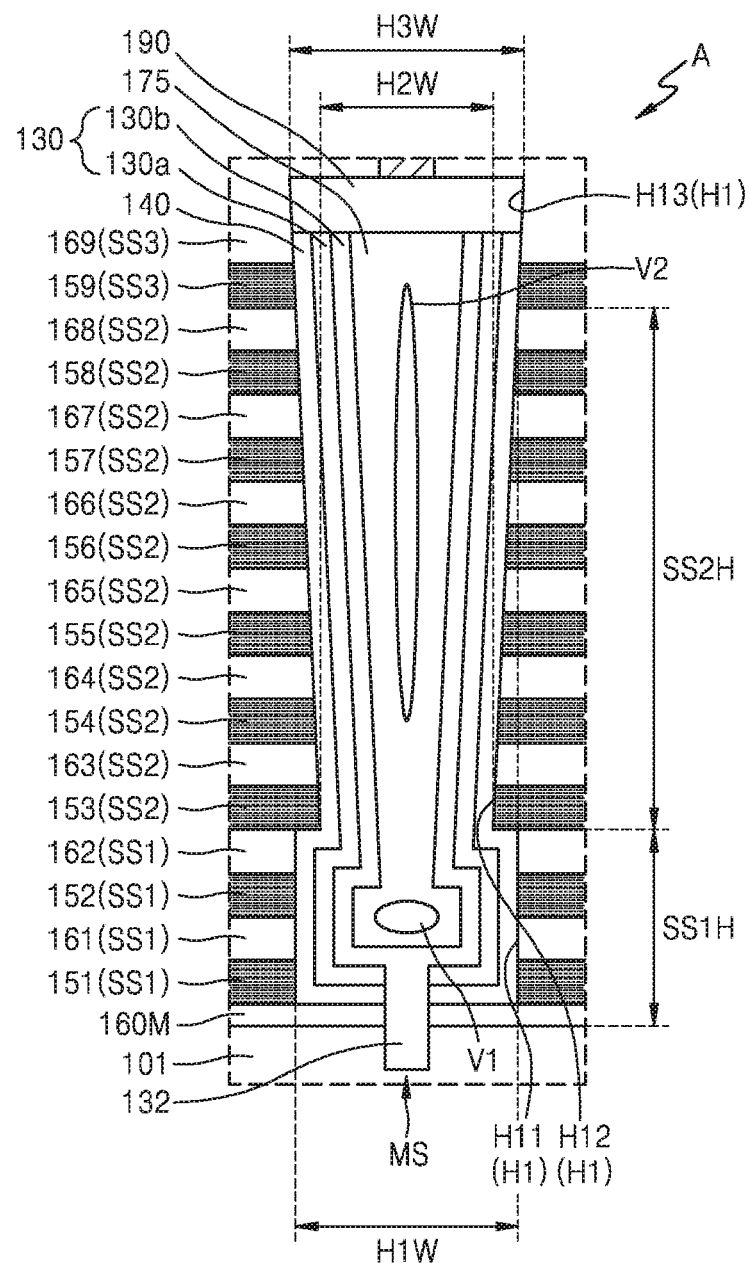
FIGS. 3A and 3B are diagrams showing an enlarged portion A of FIG. 2B.
Figure 3B:
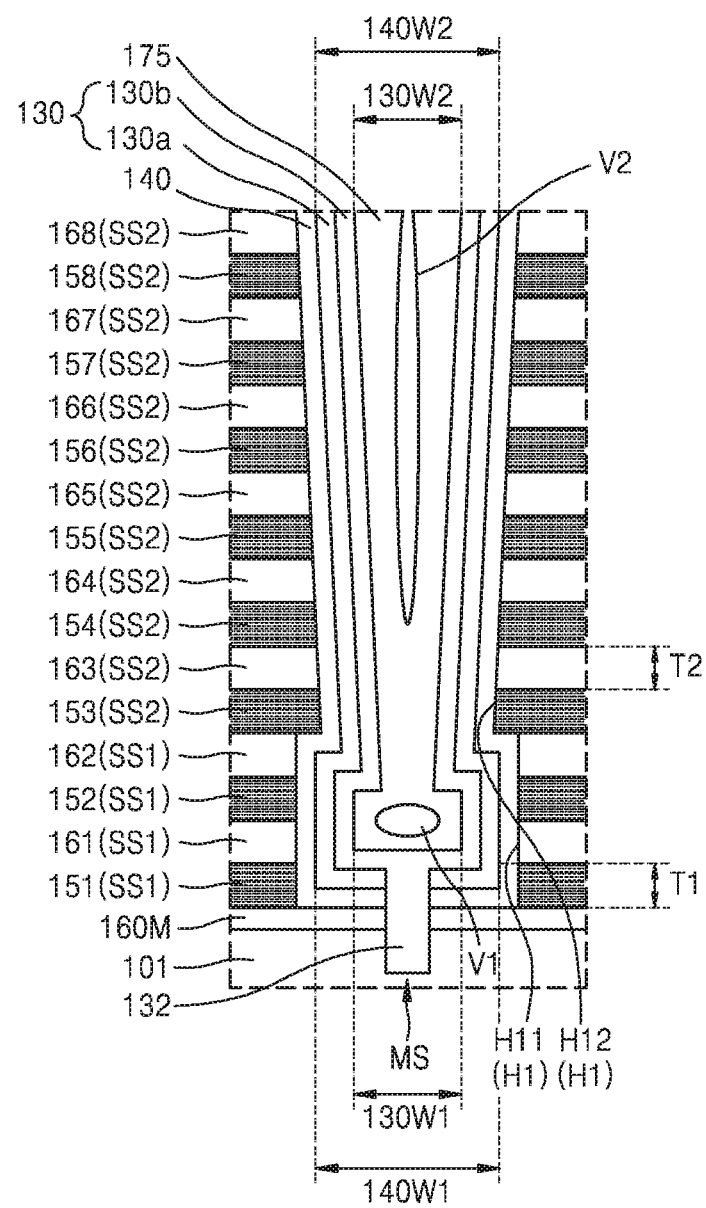
Figure 4:
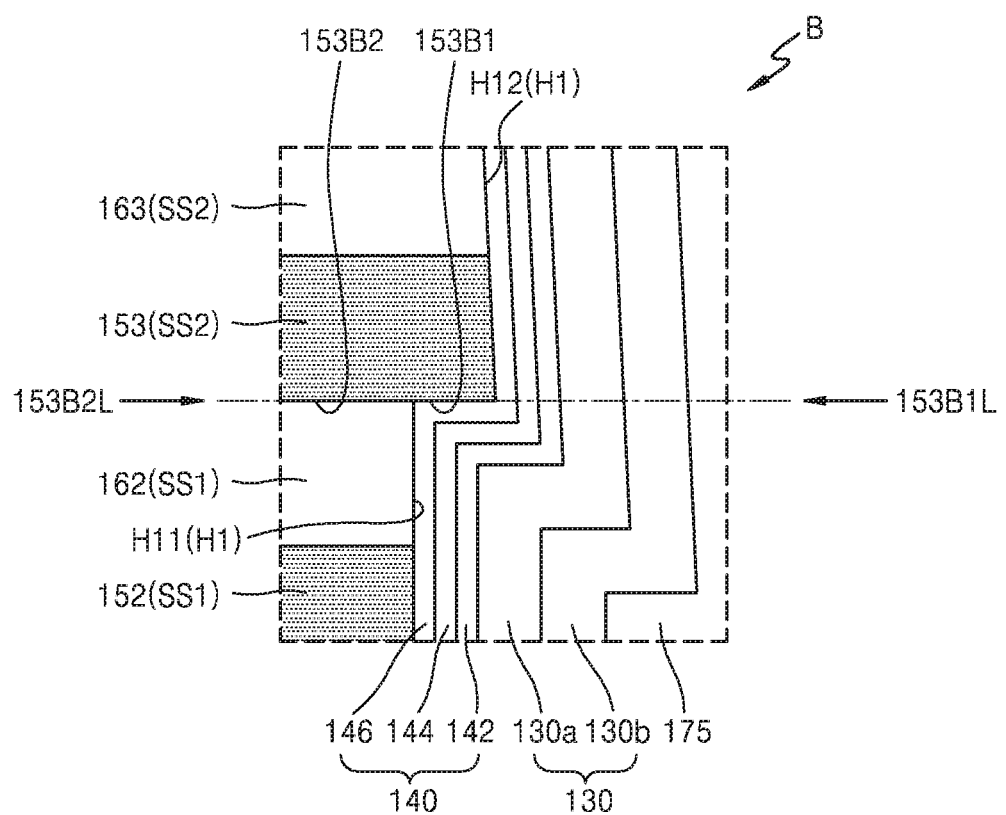
FIG. 4 is a diagram showing an enlarged portion B of FIG. 2B.

FIG. 2A is a perspective view of an example of the non-volatile memory device 10 having a vertical structure, according to the inventive concept. FIG. 2B is a cross-sectional view taken along line X-X of FIG. 2A. FIG. 2A does not show some components, e.g., a bit line 193 and a bit line contact plug 195, which are shown in FIG. 2B. FIGS. 3A and 3B are diagrams showing an enlarged portion A of FIG. 2B. FIGS. 3A and 3B show the same portion, that is, the portion A, but for convenience, FIG. 3B does not show a third structure SS3. FIG. 4 is a diagram showing an enlarged portion B of FIG. 2B.

Referring to FIGS. 1, 2A, and 2B, the non-volatile memory device 100 may include the memory cell strings MS, gate electrodes 150, and interlayer insulating layers 160, on the substrate 101.

The main surface of the substrate 101 may extend in a first direction (an x direction) and a second direction (a y direction). The substrate 101 may include a semiconductor material such as a IV-group semiconductor, a III-V-group compound semiconductor, or a II-VI-group oxide semiconductor. For example, the IV-group semiconductor may include silicon (Si), germanium (Ge), or SiGe. The substrate 101 may be a silicon-on-insulator (SOI) substrate or a germanium-on-insulator (GeOI) substrate. The substrate 101 may be a bulk wafer or an epitaxial layer. A cell region may be defined on the substrate 101. The memory cell strings MS are arranged in the cell region or in a peripheral region outside the cell region.

A lower insulating layer 160M may be formed in the cell region of the substrate 101. The lower insulating layer 160M may have a smaller thickness than the interlayer insulating layer 160, but the inventive concept is not limited thereto. In some examples of the inventive concept, the lower insulating layer 160M may be a buffer layer, such as a Middle Temperature Oxide (MTO) layer, and may insulate the gate electrodes 150 from the substrate 101.

A multilayer structure SS in which the gate electrodes 150 and the interlayer insulating layers 160 are alternately stacked in a third direction (a z direction) perpendicular to the main surface of the substrate 101 may be formed on the lower insulating layer 160M. Adjacent ones of the gate electrodes 150 of each respective pair of the gate electrodes 150 are spaced apart from each other in the third direction, and a respective interlayer insulating layer 160 may be interposed between the two adjacent gate electrodes 150. The number of gate electrodes 150 is not limited to the number shown in FIGS. 2A and 2B. In this example, two gate electrodes 151 and 152 at a lower portion of the multilayer structure SS may constitute the ground selection line GSL that forms the ground selection transistor GST described with reference to FIG. 1. Also, gate electrodes 158 and 159 at an upper portion of the multilayer structure SS may constitute the string selection line SSL that forms the string selection transistor SST described with reference to FIG. 1. Gate electrodes 153 to 157 between the gate electrodes 151 and 152 at the lower portion and the gate electrodes 158 and 159 at the upper portion may be the word lines WL that constitute the memory cell transistors MC1, MC2, . . . , MCn−1, and MCn described with reference to FIG. 1. The number of gate electrodes 150 may vary according to a capacity of the memory cell strings MS.

The gate electrode 150 may include a metal layer, for example, tungsten (W). Although not shown, the gate electrode 150 may further include a diffusion barrier (not shown), and the diffusion barrier may include, for example, tungsten nitride (WN), tantalum nitride (TaN), titanium nitride (TiN), and/or the like. The interlayer insulating layers 160 may each include silicon oxide (SiOx) or silicon nitride (SixNy).

The memory cell strings MS may extend through the multilayer structure SS in the third direction (the z direction) perpendicular to the main surface of the substrate 101. The memory cell strings MS may be arranged in a zigzag pattern. For example, the memory cell strings MS of each column thereof in the second direction (the y direction) may be off-set in the second direction from the memory cell strings MS of each column adjacent thereto in the first direction (the x direction). FIG. 2A shows a case in which two columns of the memory cell strings MS are off-set. However, the inventive concept is not limited thereto. The memory cell strings MS may be diversely arranged. In some examples of the inventive concept, the memory cell strings MS may be arranged in one column in the second direction (the y direction) or may be off-set in at least three columns in a zigzag form. Moreover, the memory cell strings MS are not limited to the zigzag form of FIG. 2A and may have a matrix structure in which the memory cell strings MS are arranged side by side in the first direction (the x direction) and the second direction (the y direction).

Each memory cell string MS may include a channel structure 130, a gate dielectric layer 140, a buried insulating layer 175, and the gate electrodes 150 arranged along an outer peripheral side surface of the gate dielectric layer 140. The portion of each memory cell string MS constituted by channel structure 130, gate dielectric layer 140, and buried insulating layer 175 may be in the form of a columnar structure.

The channel structure 130, the gate dielectric layer 140, and the buried insulating layer 175, i.e., the columnar structure, may extend through the multilayer structure SS in the third direction (the z direction) perpendicular to the main surface of the substrate 101 and may be formed in an opening H1 that exposes the lower insulating layer 160M. The opening H1 may include a first open region H11 that extends through a first width H1W of at least one layer of the multilayer structure SS at from the exposed portion of the lower insulating layer 160M, a second open region H12 that extends through a second width H2W (less than the first width H1W) of the multilayer structure SS on the first open region H11, and a third open region H13 that extend through a third width H3W (that is less than or equal to the first width H1W) of the multilayer structure SS from an upper surface of the multilayer structure SS.

That is, the multilayer structure SS may include a first structure SS1 including the first open region H11, a second structure SS2 including the second open region H12, and the third structure SS3 including the third open region H13. For example, the first structure SS1 may include four consecutive layers, that is, the gate electrodes 151 and 152 and interlayer insulating layers 161 and 162 at the lower portion of the multilayer structure SS, from an exposed portion of the lower insulating layer 160M, and may include the first open region H11 that extends through the four consecutive layers. Thus, the columnar structure may have a first section extending vertically through the lower stack of layers (e.g., the gate electrodes 151 and 152 and interlayer insulating layers 161 and 162 at the lower portion of the multilayer structure SS) and a second section extending vertically through the upper stack of layers from the second section to the upper surface of the upper stack of layers (e.g., the gate electrodes 153-159 and interlayer insulating layers 163-169 at the upper portion of the multilayer structure SS). However, the structure of the first structure SS1 is not limited thereto, and the first structure SS1 may include one layer, two layers, or three or more layers.

Also, the third structure SS3 may include two layers, that is, one interlayer insulating layer 169 and the gate electrode 159, from the upper surface of the multilayer structure SS and may also include the third open region H13 that extends through the two layers. The second structure SS2 may include gate electrodes 153 to 158 and interlayer insulating layers 163 to 168 between the first structure SS1 and the third structure SS3 and may also include the second open region H12 that extends through the gate electrodes 153 to 158 and the interlayer insulating layers 163 to 168.

The gate electrodes 150 of the first to third structures SS1 to SS3 may have the same thicknesses T1 and T2 and may include the same material. Also, the interlayer insulating layers 160 of the first to third structures SS1 to SS3 may have the same thickness and may include the same material.

The first open region H11 may be formed by a separate etching process performed prior to an etching process of forming the second and third open regions H12 and H13. That is, the first open region H11 may be formed by etching the first structure SS1 before the second and third structures SS2 and SS3 are formed. Then, the first open region H11 may be filled with a material forming the multilayer structure SS and a material having an etch selectivity and may serve as a space that defines an etch stop structure 122 (refer to FIGS. 9D and 9E) during the etching process of forming the second and third open regions H12 and H13. The etch stop structure 122 (refer to FIGS. 9D and 9E) in the first open region H11 prevents the substrate 101 from being excessively etched, and thus, dispersion of the openings H1 may be prevented along with bypassing of a current path. Bypassing of the current path may occur due to excessive etching of the substrate 101.

The first structure SS1 may have a height SS1H sufficient to allow the etch stop structure 122 (refer to FIGS. 9D and 9E), which fills the first open region H11, to prevent excessive etching. The height SS1H of the first structure SS1 is determined by the number of gate electrodes 150 and interlayer insulating layers 160 included in the first structure SS1, and thus, the first structure SS1 may have a smaller manufacturing tolerance than the etch stop structure 122 (refer to FIGS. 9D and 9E) that is arbitrarily formed and may correspond to a structure that is initially designed.

Also, the etching process of forming the first open region H11 may target the first structure SS1 having a relatively low first height SS1H and be performed as a separate etching process. Thus, in comparison with an opening that is formed by etching the multilayer structure SS, the first width H1W of the first open region H11 may be defined to correspond to an initial design. Accordingly, the first width H1W of the first open region H11 may be relatively uniform, and an inner surface of the first open region H11 may be substantially or almost perpendicular to a main surface of the substrate 101. Therefore, with particular reference to FIG. 4, the gate electrode 153 of the second structure SS2, which contacts the first structure SS1, may have a lower surface 153B1 exposed by the first open region H11.

Referring back to FIG. 3A, the first width H1W of the first open region H11 with respect to the first height SS1H may be less than or equal to 1. On the contrary, a second height SS2H of the second open region H12 that extends through most portions of the multilayer structure SS may be equal to or greater than 1.

The second structure SS2 may be on the first structure SS1 in which the first open region H11 is already formed. Thus, the gate electrode 153 contacting the first structure SS1 may have a structure in which a level 153B1L of the lower surface 153B1, which is exposed by the first open region H11, is substantially the same as a level 153B2L of an interface 153B2 between the first structure SS1 and the second structure SS2.

As described above, the etch stop structure 122 (refer to FIGS. 9D and 9E) formed in the first open region H11 may be used as an etch stop layer during the etching process of forming the second and third open regions H12 and H13 and then may be removed. The first open region H11 from which the etch stop structure 122 (refer to FIGS. 9D and 9E) is removed may be contiguous with the second and third open regions H12 and H13 and used as part of the opening H1.

In this case, a width of the opening H1 at the upper portion of the multilayer structure SS may be relatively narrow while the opening H1 extends through the multilayer structure SS. That is, the opening H1 may include the third open region H13, which has the third width H3W (addition) that is greater than the first width H1W of the first open region H1, as well as the second open region H12 that has the second width H2W less than the first width H1W, on the first open region H11. The first open region H11 forms a space having the sufficient first width H1W on a lower portion of the second open region H12, and thus an etching process margin of a contact hole CH1 for forming an electrical connection portion with the substrate 101 in the opening H1 may be sufficiently secured.

The etch stop structure 122 in the first open region H11 and a process of forming the first open region H11 will be described More specifically with reference to FIGS. 9A to 9Q.

The gate dielectric layer 140 may cover an inner surface and a lower surface defining the side(s) and the bottom of the opening H1. The gate dielectric layer 140 may be situated between the channel structure 130 and the gate electrodes 150. Referring to FIGS. 3A and 3B, because the first width H1W of the first open region H11 is greater than the second width H2W of the second open region H12, a distance 140W1 between inner surfaces (or spacing of opposite walls) of the gate dielectric layer 140 in the first open region H11 may be greater than a distance 140W2 between inner surfaces (or spacing of the opposite walls) of the gate dielectric layer 140 in the second open region H12.

Moreover, the first section of the columnar structure occupying the first open region H11 contacts the lower layers (e.g., gate electrodes 151 and 152 and insulating layers 161 and 162) and has a rectangular cross section in a vertical plane extending perpendicular to the main surface of the substrate. The second section of the columnar structure occupying the second open region H11 contacts the upper layers (e.g., gate electrodes 153-159 and insulating layers 163-169) and has a cross section in the vertical plane that tapers in a downward direction from the uppermost surface of the multilayer structure SS to the first section of the columnar structure occupying the first open region H11.

In some examples of the inventive concept, the gate dielectric layer 140 may comprise one of an oxide-nitride-oxide (ONO) layer, an oxide-nitride-alumina (ONA) layer, and an oxide-nitride-oxide-alumina (ONOA) layer.

Also, referring to FIG. 4, the gate dielectric layer 140 may have a structure in which a tunneling insulating layer 142, a charge storage layer 144, and a blocking insulating layer 146 are sequentially stacked from a left side wall of the channel structure 130. Thus, the gate dielectric "layer" 140 may be referred to as a gate dielectric to describe the examples in which different layers of dielectric materials line the opening H1.

The tunneling insulating layer 142 may allow charges to tunnel through the charge storage layer 144 by Fowler-Nordheim (F-N) tunneling. The tunneling insulating layer 142 may be a single layer or a multilayer including, for example, one or more of $SiO_x$, $Si_xN_y$, silicon oxynitride (SiON), hafnium oxide ($HfO_x$), hafnium silicon oxide ($HfSi_xO_y$), aluminum oxide ($Al_xO_y$), and zirconium oxide ($ZrO_x$).

The charge storage layer 144 may be a charge trap layer or a floating gate conductive layer. When the charge storage layer 144 is a floating gate conductive layer, the charge storage layer 144 may be formed by depositing polysilicon by Chemical Vapor Deposition (CVD), e.g., Low Pressure Chemical Vapor Deposition (LPCVD), using silane ($SiH_4$) or disilane ($Si_2H_6$) and phosphine ($PH_3$). When the charge storage layer 144 is a charge trap layer, the charge storage layer 144 may include at least one of $SiO_x$, $Si_xN_y$, SiON, $HfO_x$, $ZrO_x$, tantalum oxide ($Ta_xO_y$), titanium oxide ($TiO_x$), hafnium aluminum oxide ($HfAl_xO_y$), hafnium tantalum oxide ($HfTa_xO_y$), $HfSi_xO_y$, aluminum nitride ($Al_xN_y$), and aluminum gallium nitride ($AlGa_xN_y$).

In some examples of the inventive concept, the charge storage layer 144 may include quantum dots or nano crystals. The quantum dots or nano crystals may include conductors, for example, metals or fine particles of a semiconductor.

The blocking insulating layer 146 may include at least one of $SiO_x$, $Si_xN_y$, SiON, and a high-k dielectric material. The high-k dielectric material may be a dielectric material having a greater dielectric constant than an oxide layer.

In some examples of the inventive concept, the blocking insulating layer 146 may include a material having higher permittivity than the tunneling insulating layer 142. For example, the blocking insulating layer 146 may include at least one of $Al_xO_y$, $Ta_xO_y$, $TiO_x$, yttrium oxide ($Y_xO_y$), $ZrO_x$, zirconium silicon oxide ($ZrSi_xO_y$), $HfO_x$, $HfSi_xO_y$, lanthanum oxide (LaxOy), lanthanum aluminum oxide ($LaAl_xO_y$), lanthanum hafnium oxide ($LaHf_xO_y$), $HfAl_xO_y$, and praseodymium oxide ($Pr_xO_y$).

The channel structure 130 may extend on surfaces that define the side and bottom of the opening H1 and extend on the gate dielectric layer 140. The channel structure 130 may be annular in the opening H1. However, the inventive concept is not limited thereto. The channel structure 130 may have a cylindrical shape or a quadrangular-prism shape. Referring to FIGS. 3A and 3B together, because the first width H1W of the first open region H11 is greater than the second width H2W of the second open region H12, a distance 130W1 between inner surfaces (or a spacing of opposite side walls) of the channel structure 130 in the first open region H11 may be greater than a distance 130W2 between the inner surfaces (or a spacing of the opposite side walls) of the channel structure 130 in the second open region H12.

The channel structure 130 may extend through the lower insulating layer 160M and thus may be electrically connected to the substrate 101. For example, as shown in the drawings, the channel structure 130 includes a contact portion 132 protruding from a lower surface of the channel structure 130 and may be connected to the substrate 101 through the contact portion 132.

In some examples of the inventive concept, the channel structure 130 may include a first channel layer 130a and a second channel layer 130b. The first channel layer 130a may cover the gate dielectric layer 140, and the second channel layer 130*b* may cover the first channel layer 130*a*.

In some examples of the inventive concept, the second channel layer 130*b* may include the contact portion 132 that extends through the first channel layer 130*a*, the gate dielectric layer 140, and the lower insulating layer 160M and thus is connected to the substrate 101.

The first channel layer 130*a* and the second channel layer 130*b* may each include, for example, a semiconductor material such as polysilicon or monocrystalline silicon. The first channel layer 130*a* and the second channel layer 130*b* may include the same material. However, the inventive concept is not limited thereto.

In some examples of the inventive concept, the first channel layer 130*a* and the second channel layer 130*b* may each include polysilicon doped with n-type impurities such as phosphorus (P), arsenic (As), or antimony (Sb) or p-type impurities such as Al, boron (B), indium (In), or potassium (K). In other examples of the inventive concept, the first channel layer 130*a* and the second channel layer 130*b* may each include polysilicon that is not doped with impurities.

The buried insulating layer 175 may extend over the sides and bottom of the opening H1 within the channel structure 130. In this case, the buried insulating layer 175 may include a first void V1 that is isolated within the first open region H11. The first void V1 in the first open region H11 may have a shape having an aspect ratio that is relatively close to 1, according to a shape of the first open region H11. Although a second void V2 may be formed in the second and third open regions H12 and H13, the second void V2 may have a shape having an aspect ratio of much greater than 1 because the second void V2 extends in a direction perpendicular to the substrate 101.

A conductive layer 190 may be disposed on upper surfaces of the channel structure 130, the gate dielectric layer 140, and the buried insulating layer 175. The conductive layer 190 may be electrically connected to the channel structure 130. The conductive layer 190 may include, for example, doped polysilicon. The conductive layer 190 may function as a drain region of the string selection transistor SST described with reference to FIG. 1.

An impurity region 105 may be situated within the substrate 101. The impurity region 105 may be located at the main surface of the substrate 101 and extend in the second direction (the y direction). FIGS. 2A and 2B show only one impurity region 105, but there may be multiple impurity regions between the channel structures 130 that are adjacent to each other in the first direction (the x direction). In some examples of the inventive concept, the impurity region 105 may be a source region and may form a PN junction with another region of the substrate 101.

A common source line structure 170 may extend through the impurity region 105. In some examples of the inventive concept, the common source line structure 170 may include a common source line 172 and a common source line spacer 174.

As illustrated, the memory cell strings MS are symmetrically arranged about the common source line structure 170. However, the inventive concept is not limited thereto. In some examples of the inventive concept, adjacent memory cell strings MS may be asymmetrically arranged about the common source line structure 170.

The common source line 172 may be present in the impurity region 105 of the substrate 101. For example, the common source line 172 may extend in the second direction (the y direction) in some portions of the impurity region 105. In some cases, the common source line 172 may be formed over an entire upper portion of the impurity region 105 in the second direction (the y direction).

In some examples of the inventive concept, the common source line 172 may include a metal such as tungsten (W), Al, copper (Cu), Ti, or Ta. In other examples of the inventive concept, the common source line 172 may include a conductive material such as polysilicon doped with impurities or metal silicide, e.g., nickel silicide, titanium silicide, tungsten silicide, or cobalt silicide.

The common source line spacer 174 including an insulating material may be disposed on both side walls of the common source line 172. The common source line spacer 174 may be disposed on side walls of the gate electrodes 150 and function as an isolation layer that electrically insulates the gate electrode 150 and the common source line 172 from each other.

The common source line structure 170 may extend through the lower insulating layer 160M and contact the substrate 101. Accordingly, the lower surface of the common source line structure 170 may be at a lower level than the main surface of the substrate 101.

An upper insulating layer 181 may be disposed on the multilayer structure SS and the conductive layer 190. An upper surface of the upper insulating layer 181 may lie at substantially the same level as an upper surface of the common source line 172.

A common source line buried insulating layer 183 that covers at least some portions of the upper surface of the common source line 172 may be disposed on the upper insulating layer 181. The common source line buried insulating layer 183 may be interposed between the common source line 172 extending in the second direction (the y direction) and the bit line 193 extending in the first direction (the x direction) above the common source line 172 and may function as an isolation layer that electrically insulates the common source line 172 and the bit line 193 from each other.

The bit line 193 extending in the first direction (the x direction) and having a linear pattern may be disposed on the common source line buried insulating layer 183. The bit line 193 may be electrically connected to the conductive layer 190 through the bit line contact plug 195 that extends through the upper insulating layer 181 and the common source line buried insulating layer 183.

Figure 5:
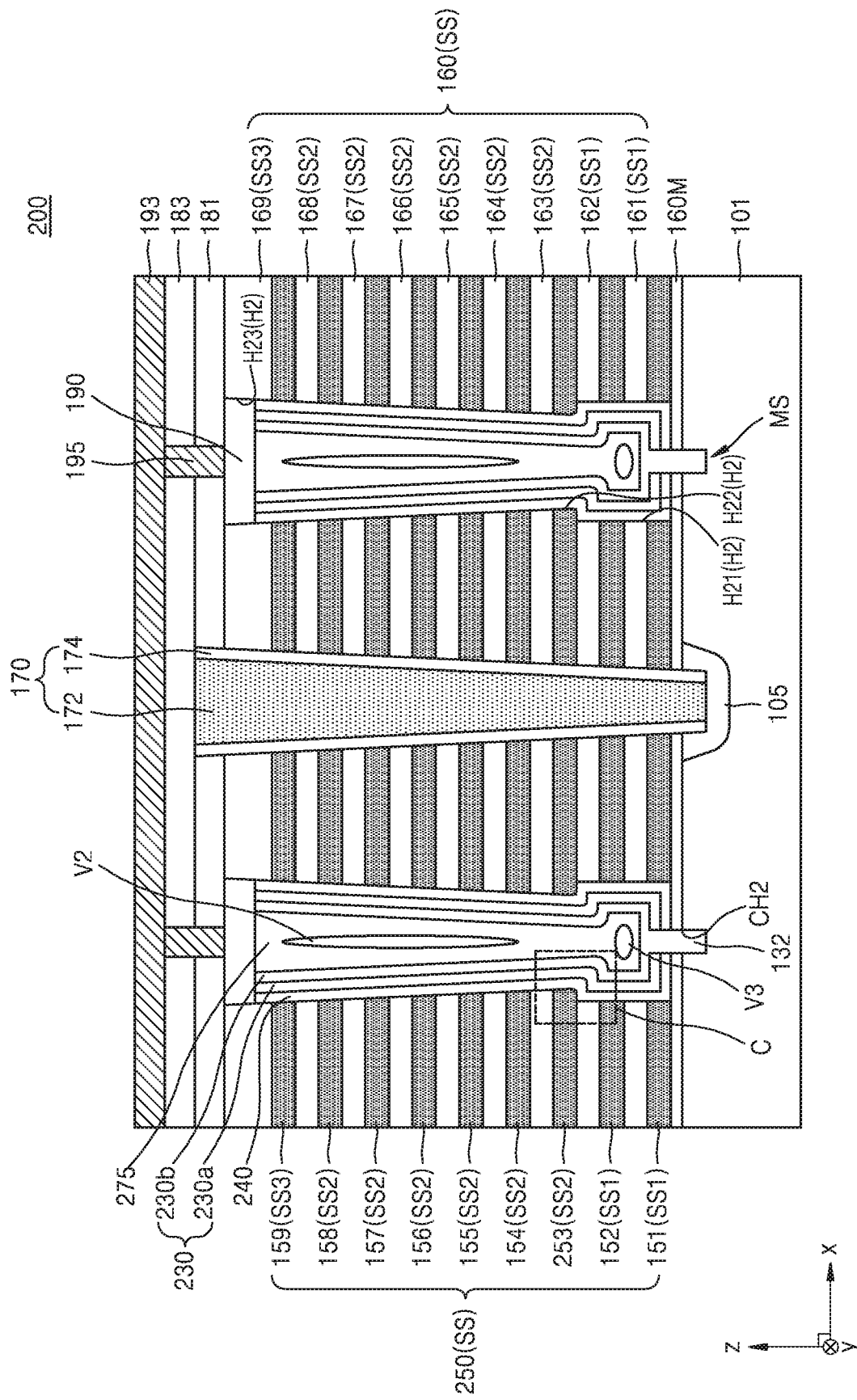
FIG. 5 is a cross-sectional view of an example of a non-volatile memory device having a vertical structure, according to the inventive concept.
Figure 6:
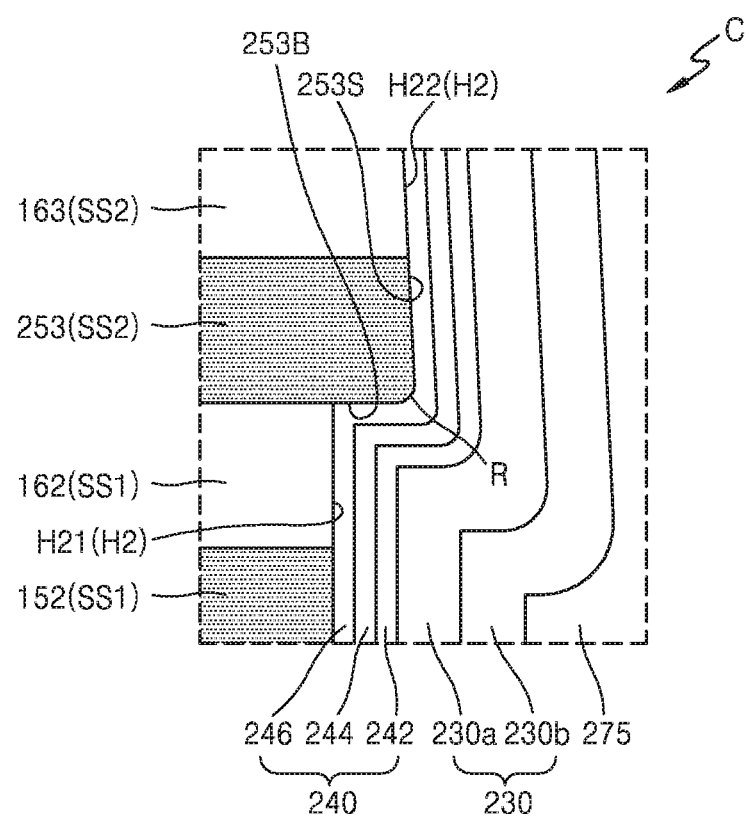
FIG. 6 is a diagram showing an enlarged portion C of FIG. 5.

FIG. 5 is a cross-sectional view of an example of a non-volatile memory device 200 having a vertical structure according to the inventive concept. FIG. 6 is a diagram showing an enlarged portion C of FIG. 5. Like reference numerals in the drawings denote like elements, and repeated descriptions thereof are omitted.

Referring to FIGS. 5 and 6, an opening H2 may be formed to expose the lower insulating layer 160M by extending through the multilayer structure SS in the third direction (the z direction) perpendicular to the main surface of the substrate 101. The channel structure 230, a gate dielectric layer 240, and a buried insulating layer 275 may be formed in the opening H2. A first open region H21 may be formed, the first open region H21 extending through at least one layer of the multilayer structure SS at a first width from the exposed portion of the lower insulating layer 160M. Above the first open region H21, a second open region H22, which extends through the multilayer structure SS at a second width less than the first width, and a third open region H23, which extends through the multilayer structure SS at a third width that is the equal to or greater than the first width from the upper surface of the multilayer structure SS, may be further formed.

Gate electrodes 250 may be sequentially stacked along the sides of the opening H2 in the third direction (the z direction) perpendicular to the substrate 101. In this case, the bottom surface of a gate electrode 253 that is disposed beside the first open region H21 may have a rounded outer peripheral surface R. As a result, the columnar structure occupying the opening H2 has a fillet along an outer circumferential portion of the columnar structure at which the first section of the columnar structure occupying the first open region H21 and the second section of the columnar structure occupying the second open region H22 meet.

More specifically, a region where a lower surface 253B exposed by the first open region H21 contacts a side surface 253S exposed by the second open region H22 may have the rounded outer peripheral surface R. This structure may be formed by a process of forming the first open region H21, which is performed prior to a separate etching process.

That is, as a process of etching the second and third open regions H22 and H23 is performed, the lower surface 253B of the gate electrode 253, which is exposed by the first open region H21 that is previously formed, may be exposed by etchant. More specifically, a portion of the lower surface 253B of the gate electrode 253, which is adjacent to the side surface 253S thereof, may start to be exposed by etchant. Accordingly, an edge on which the lower surface 253B of the gate electrode 253 is in contact with the side surface 253S thereof may be round. A process of forming the outer peripheral surface R will be described more specifically with reference to FIGS. 10A and 10B.

Figure 7:
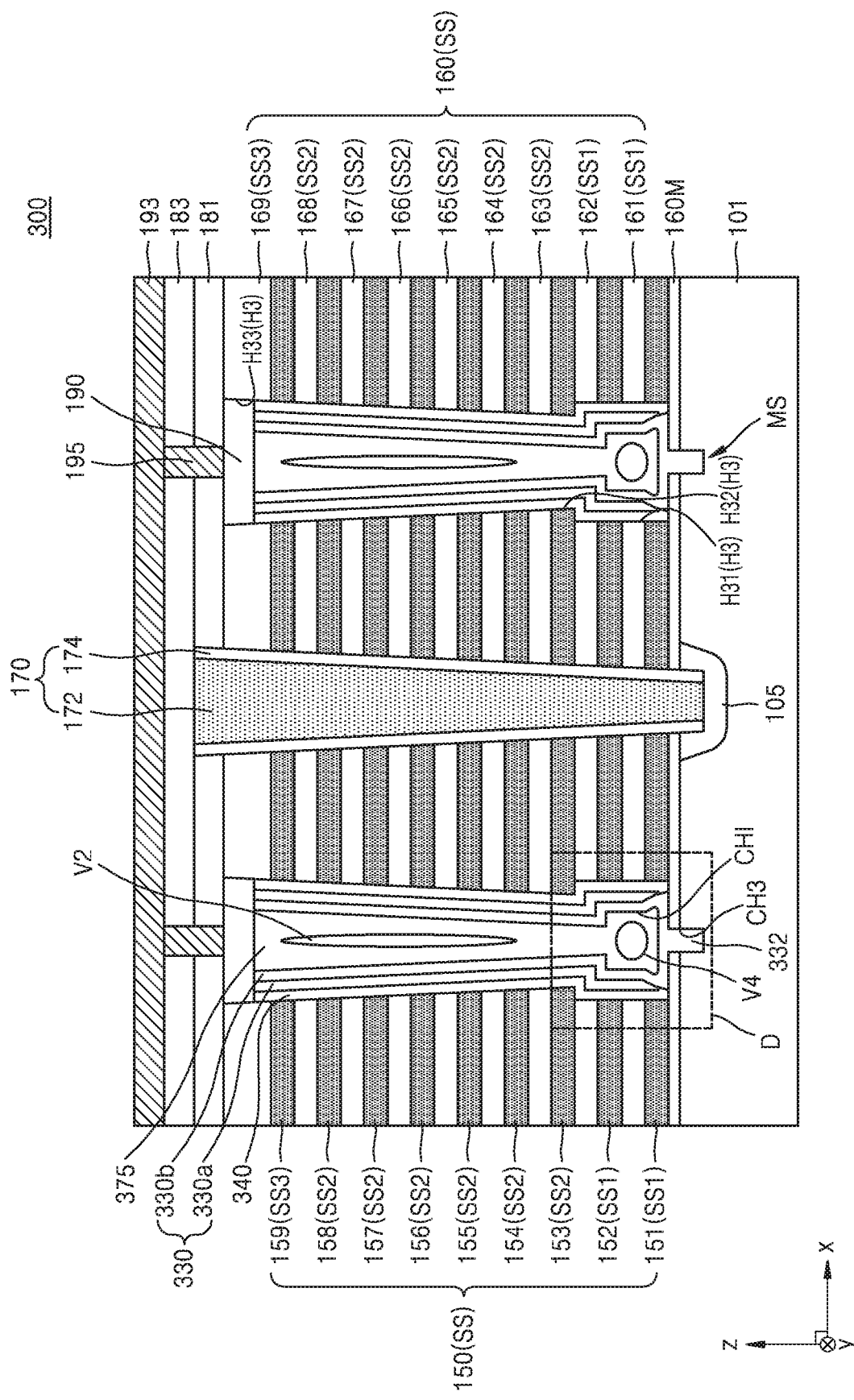
FIG. 7 is a cross-sectional view of an example of a non-volatile memory device having a vertical structure, according to the inventive concept.
Figure 8:
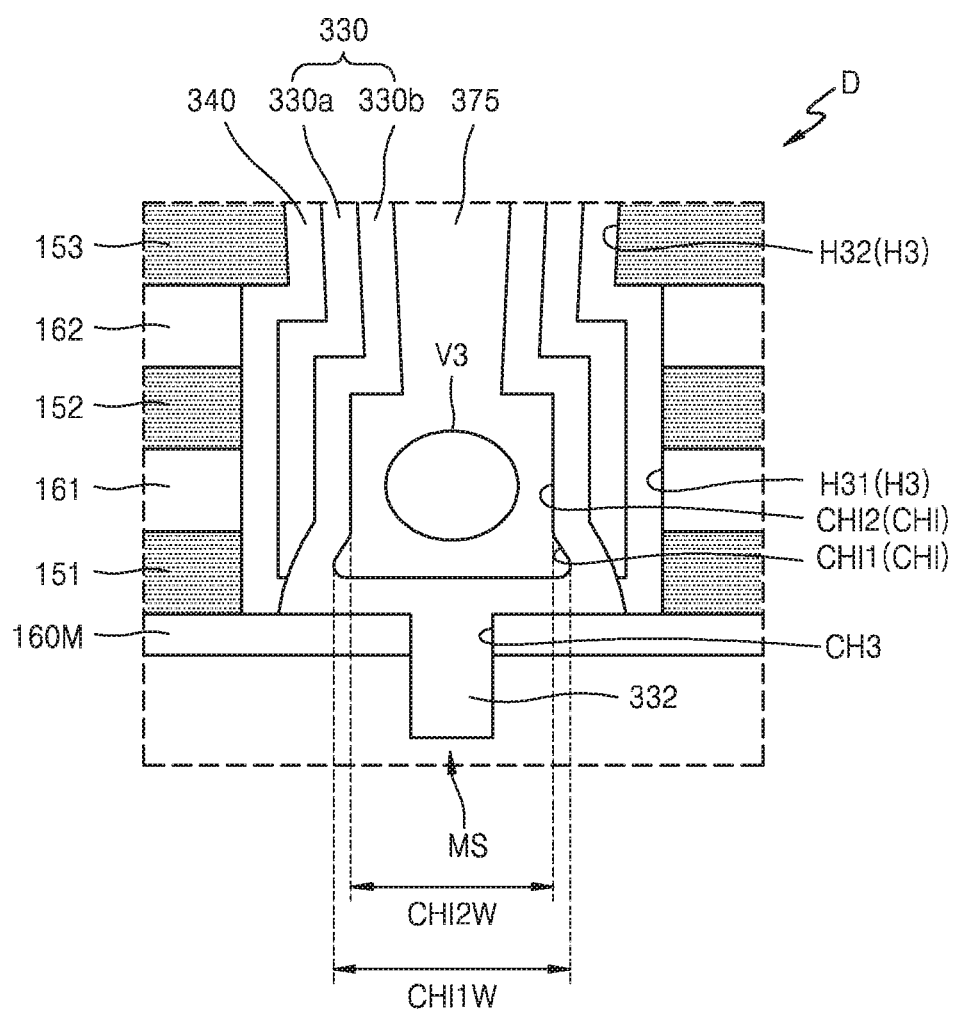
FIG. 8 is a diagram showing an enlarged portion D of FIG. 7.

FIG. 7 is a cross-sectional view of an example of a non-volatile memory device 300 having a vertical structure according to the inventive concept. FIG. 8 is a diagram showing an enlarged portion D of FIG. 7.

Referring to FIGS. 7 and 8, the channel structure 330 may be disposed on a gate dielectric layer 340 within an opening H3. The opening H3 includes a first open portion H31, a second open portion H32 and a third open portion H33. The channel structure 330 may extend through the lower insulating layer 160M at the bottom of the opening H3 and thus may be electrically connected to the substrate 101. For example, as illustrated, the channel structure 330 may include a contact portion 332 protruding from a lower surface of the channel structure 330 and may be electrically connected to the substrate 101 through the contact portion 332.

In this case, the channel structure 330 in the first open portion H31 may have a bulb shape having a width that increases toward a portion of the channel structure 330 that is adjacent to the lower insulating layer 160M. More specifically, an inner surface CHI of the channel structure 330 in the first open portion H31 may include a first inner-surface region CHI1 adjacent to the lower insulating layer 160M and a second inner-surface region CHI2 on the first inner-surface region CHI1. In this case, a width CHI1W of the channel structure 330 in the first inner-surface region CHI1 may be greater than a width CHI2W of the channel structure 330 in the second inner-surface region CHI2. That is, the second inner-surface region CHI2 may be concave in a lateral direction.

Thus, the channel structure 330 (and especially the layer 330b thereof) and the buried insulating layer 375 each have a lowermost portion that flares radially outwardly.

The above-described structure may be formed by a process of removing the gate dielectric layer 340 that is adjacent to a contact hole CH3 in order to secure an etch margin of the contact hole CH3 before the contact hole CH3 for exposing the substrate 101 is formed.

Figure 9A:
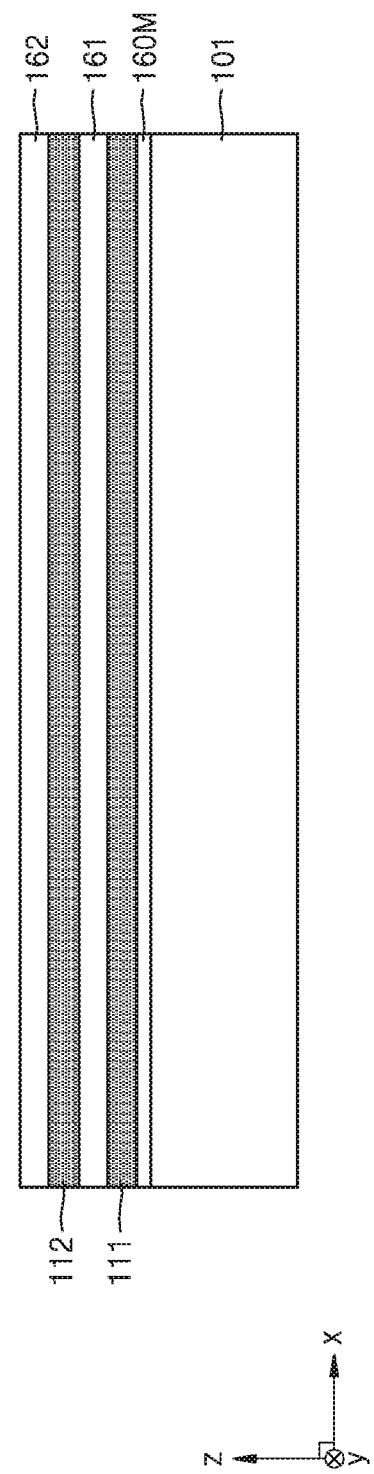
Figure 9C:
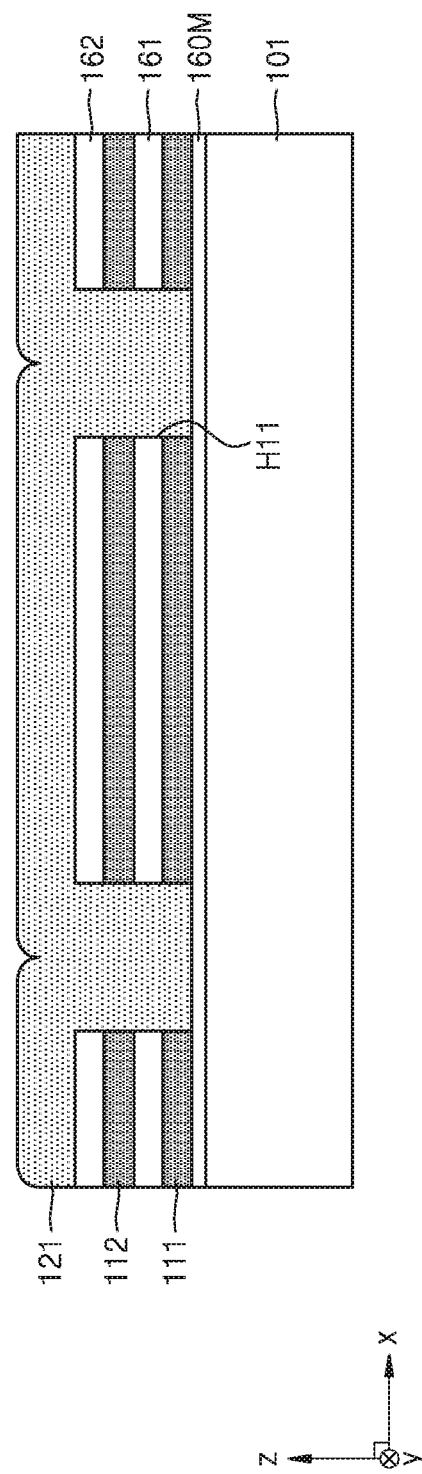
Figure 9D:
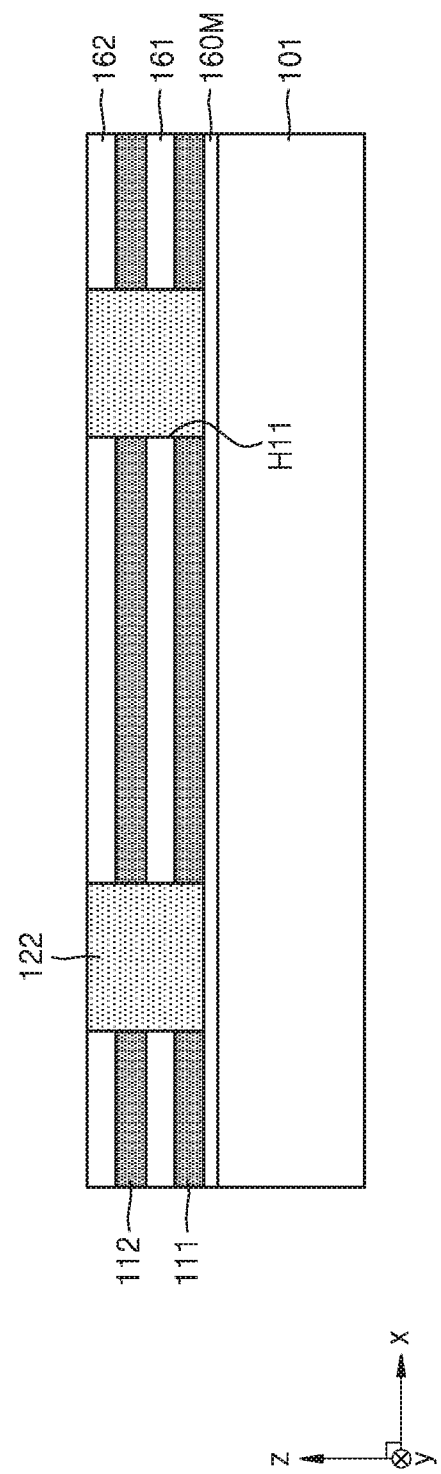
Figure 9E:
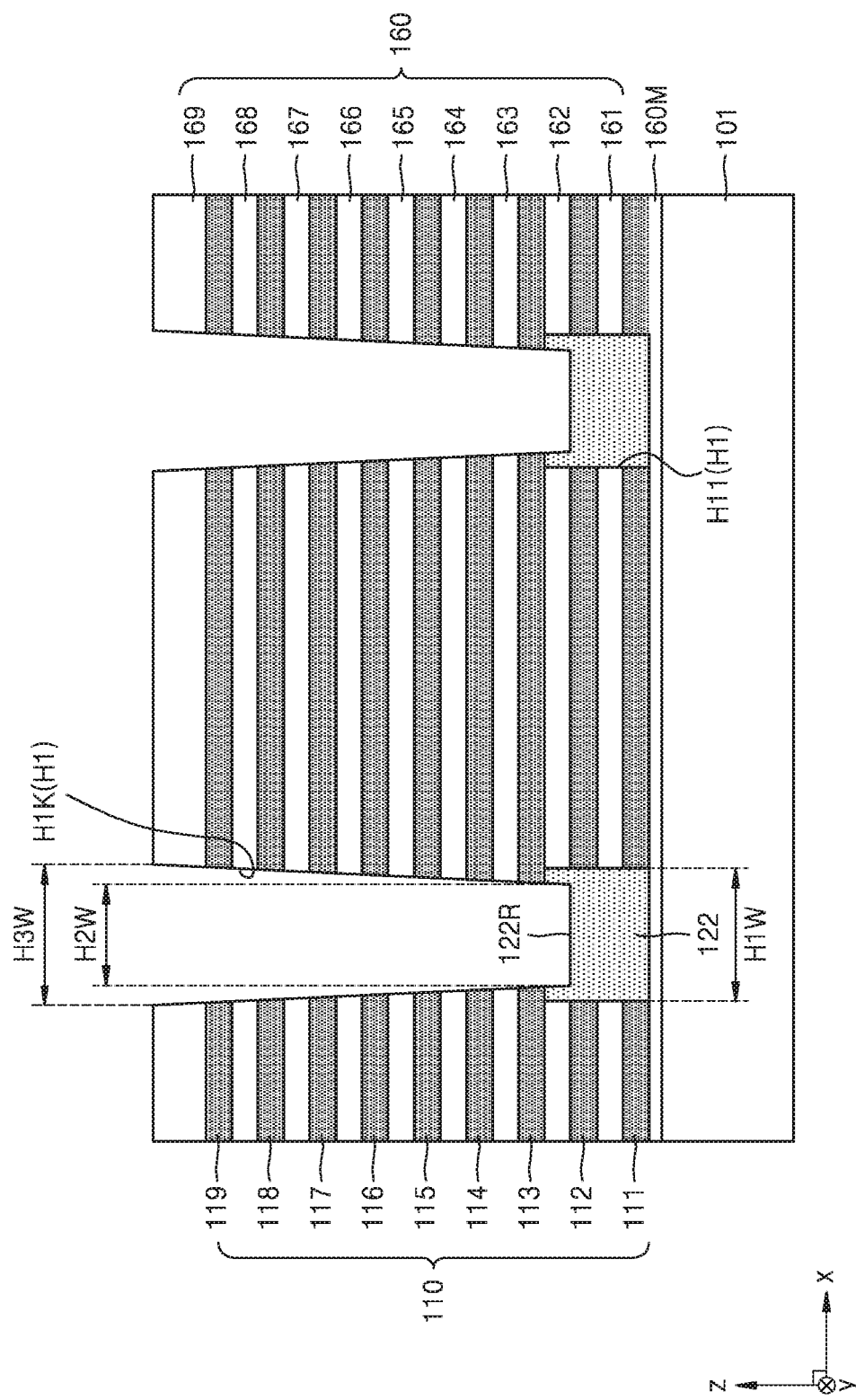
Figure 9F:
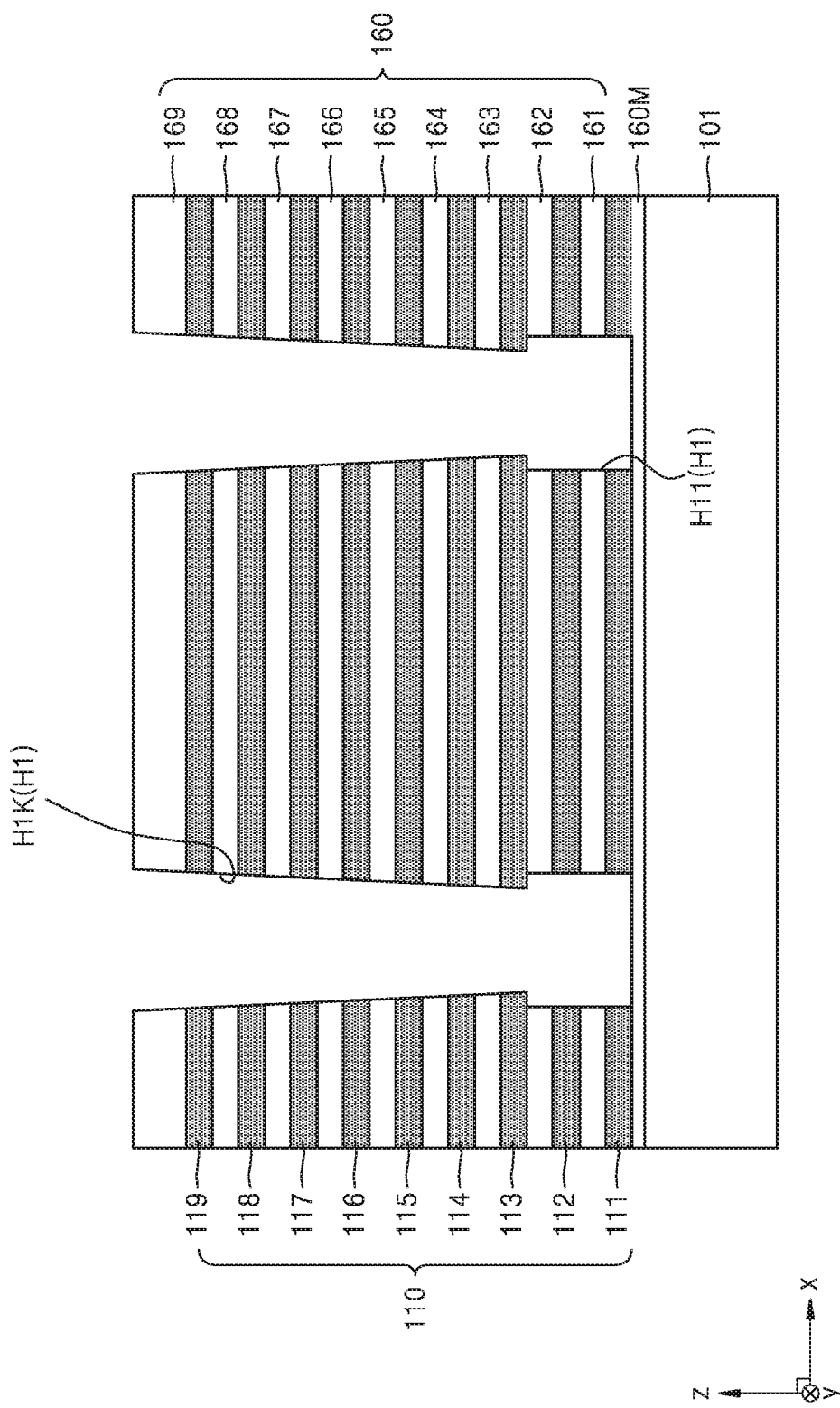
Figure 9G:
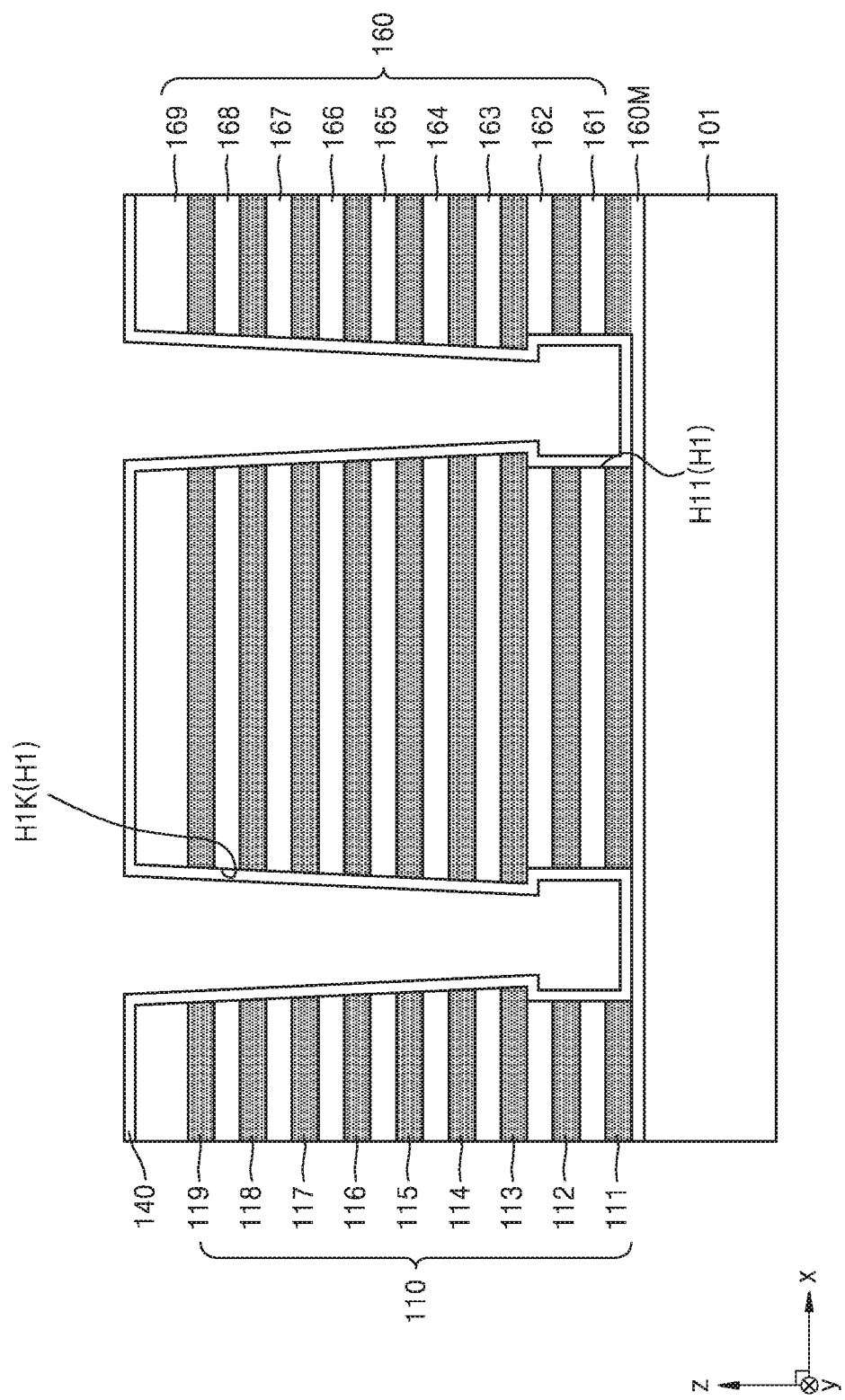
Figure 9H:
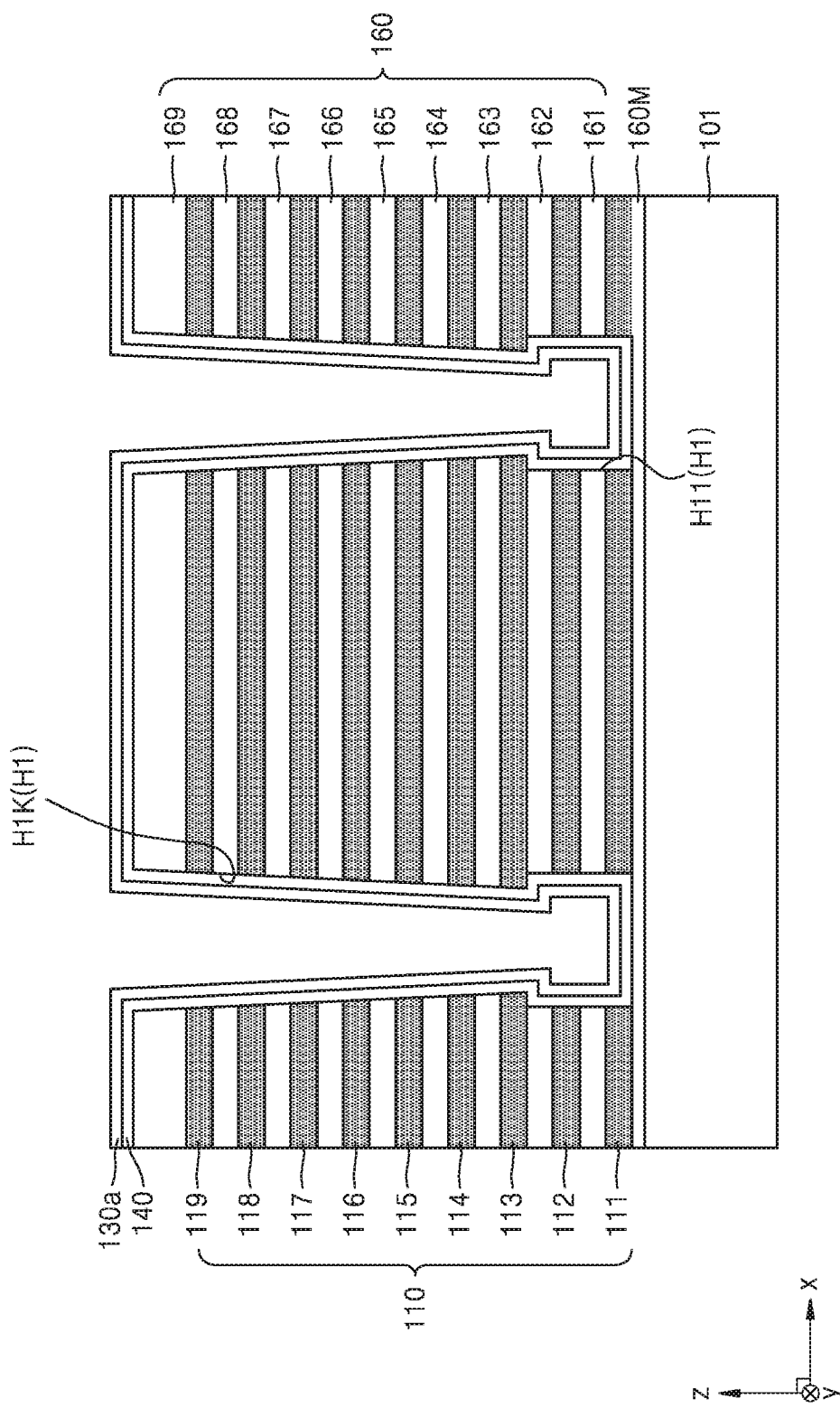
Figure 9I:
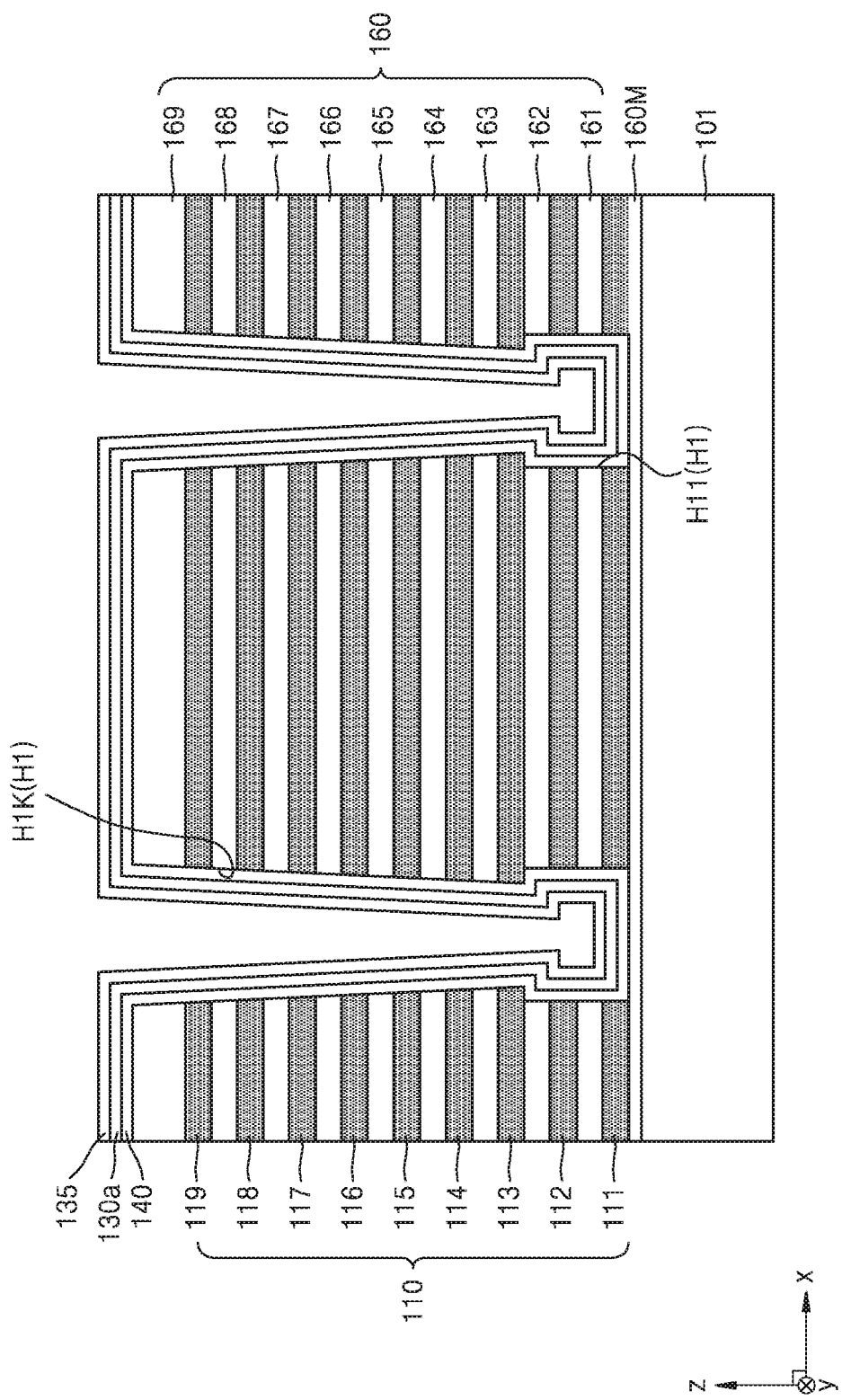
Figure 9J:
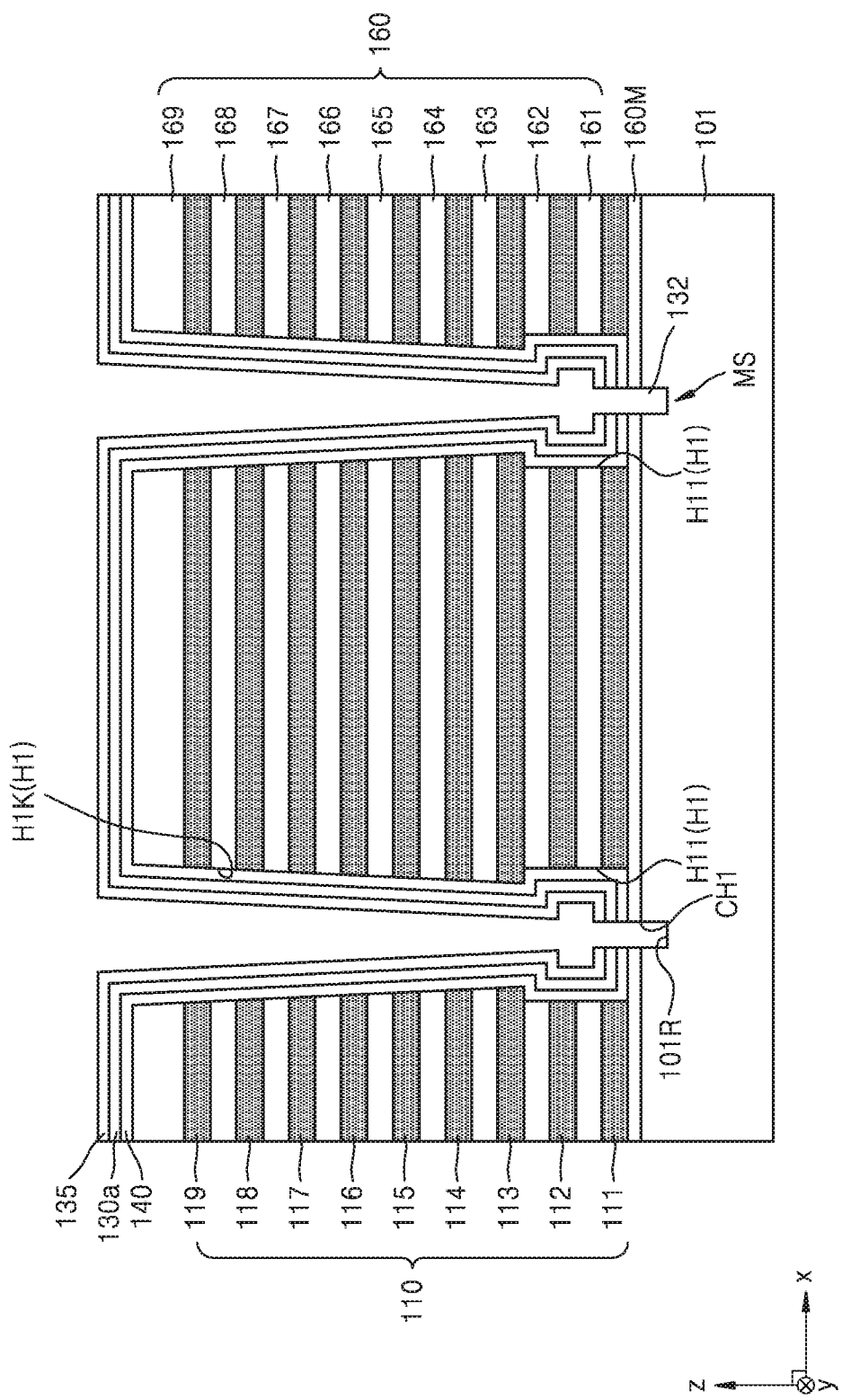
Figure 9K:
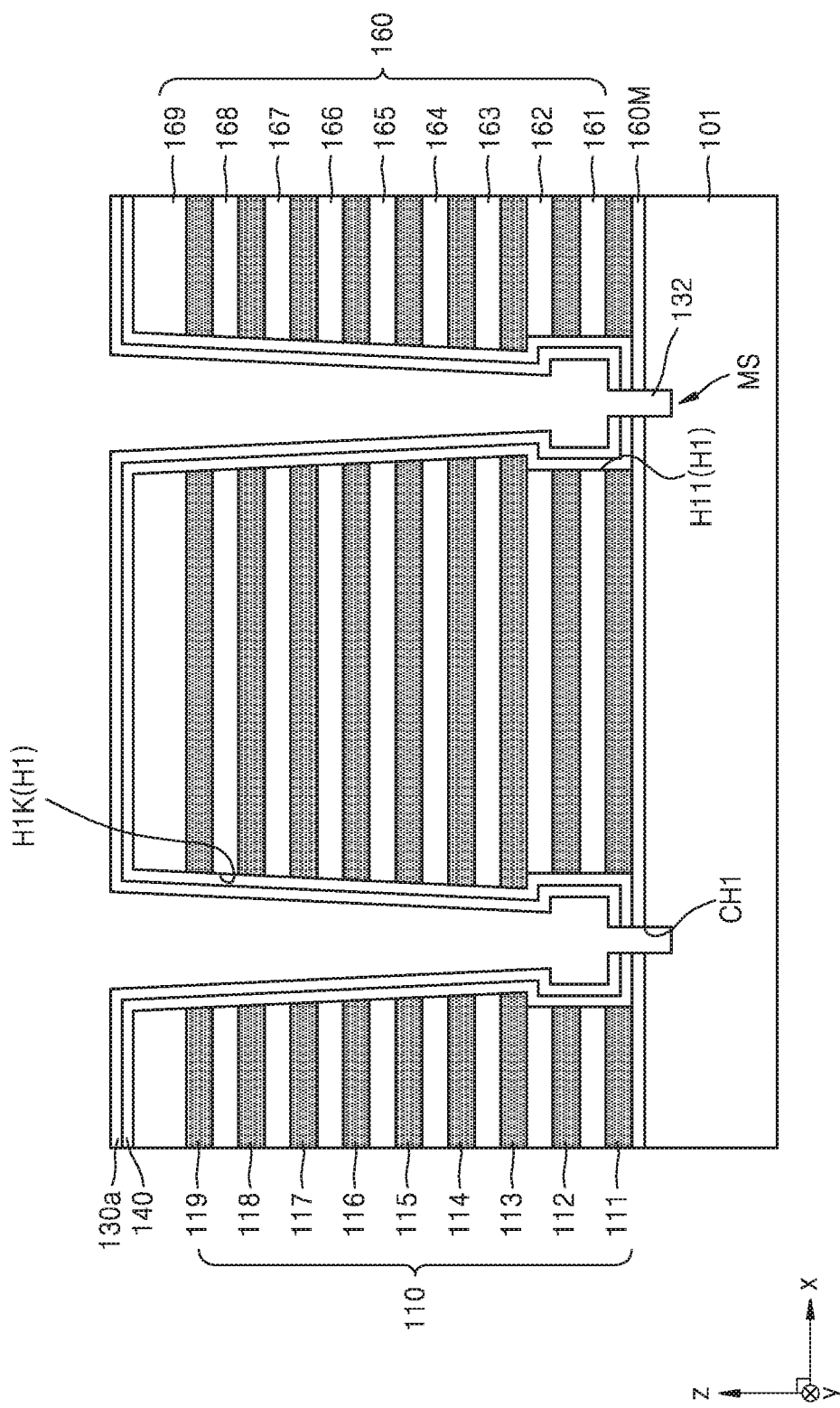
Figure 9L:
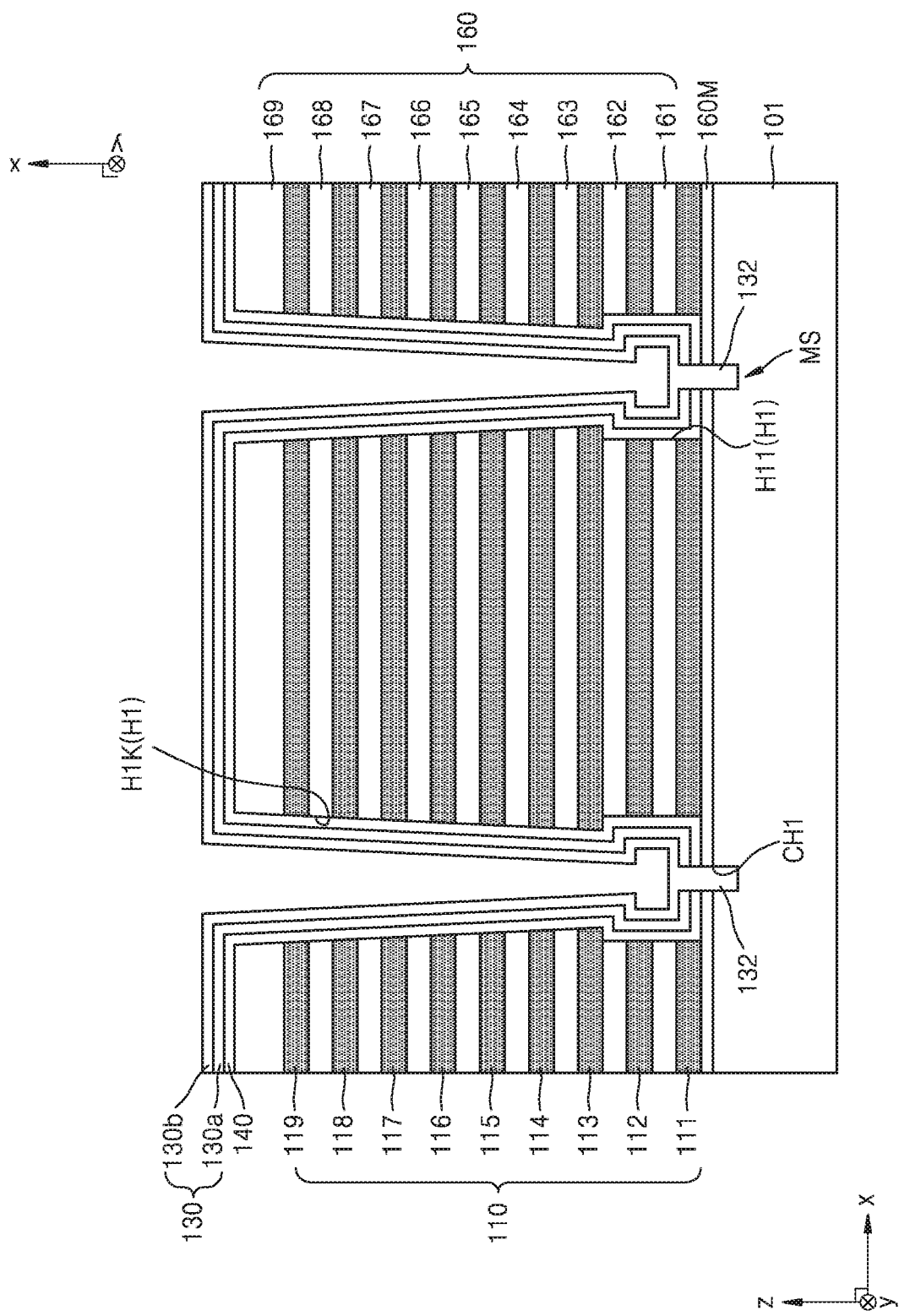
Figure 9M:
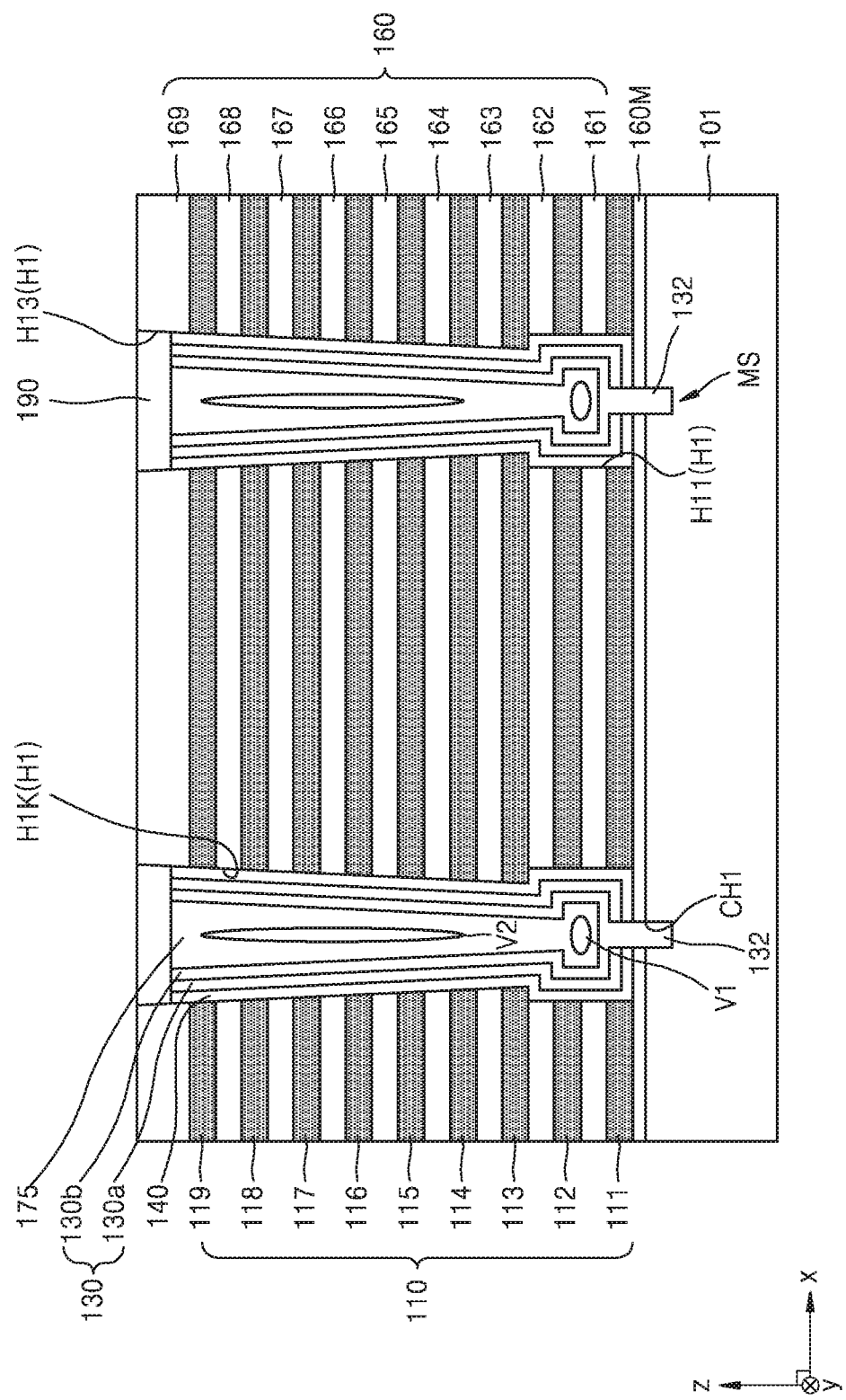
Figure 9N:
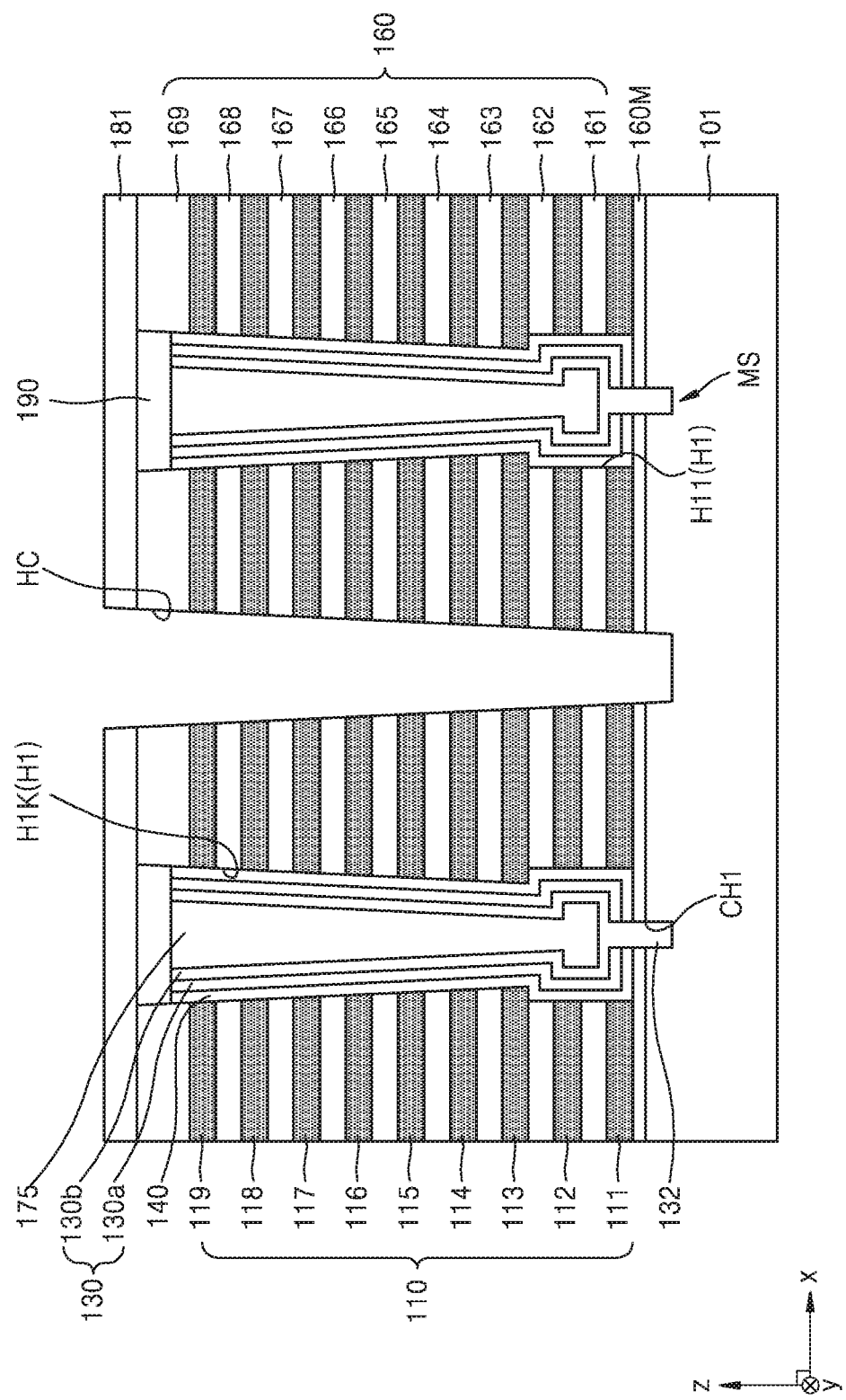
Figure 9O:
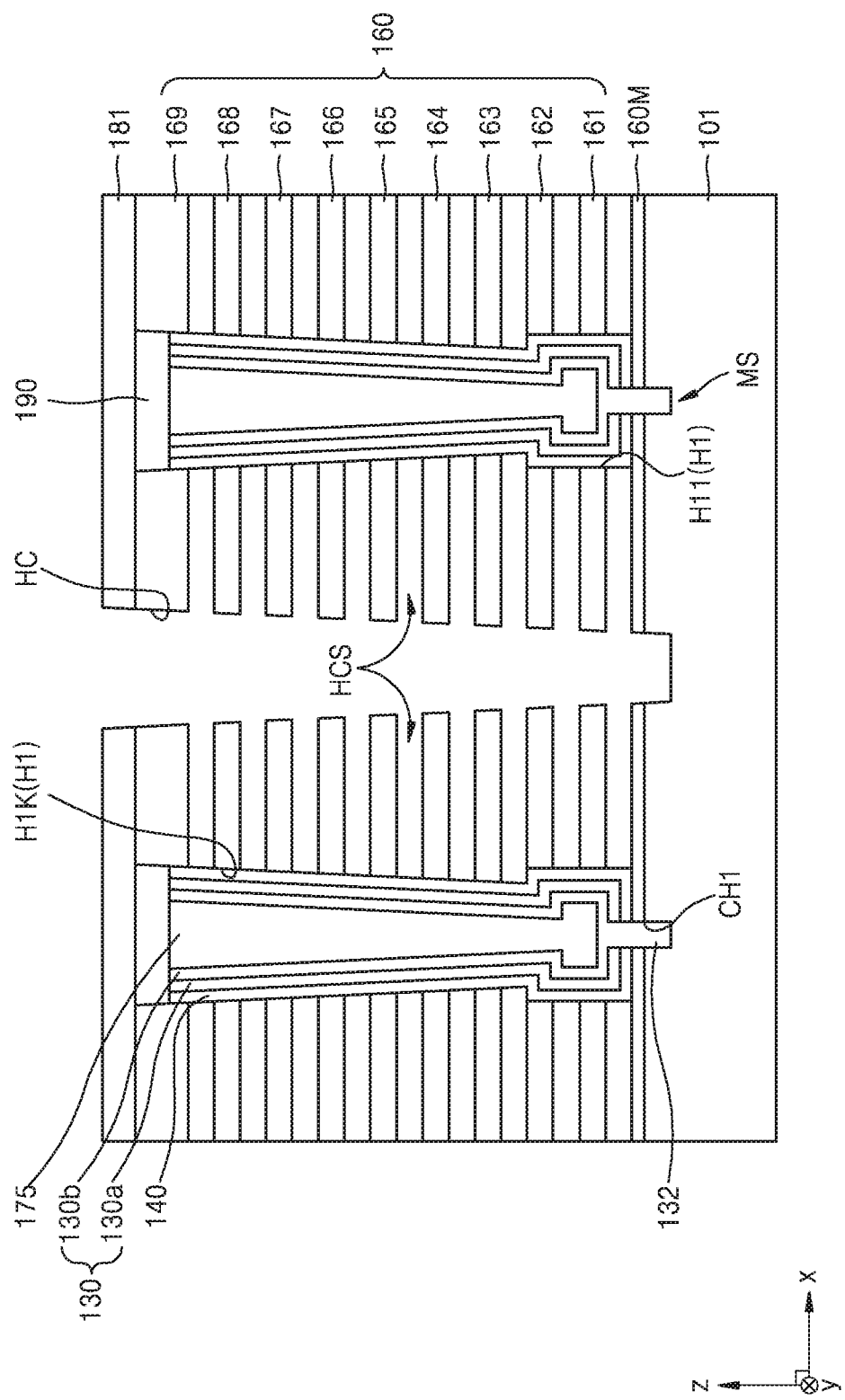
Figure 9P:
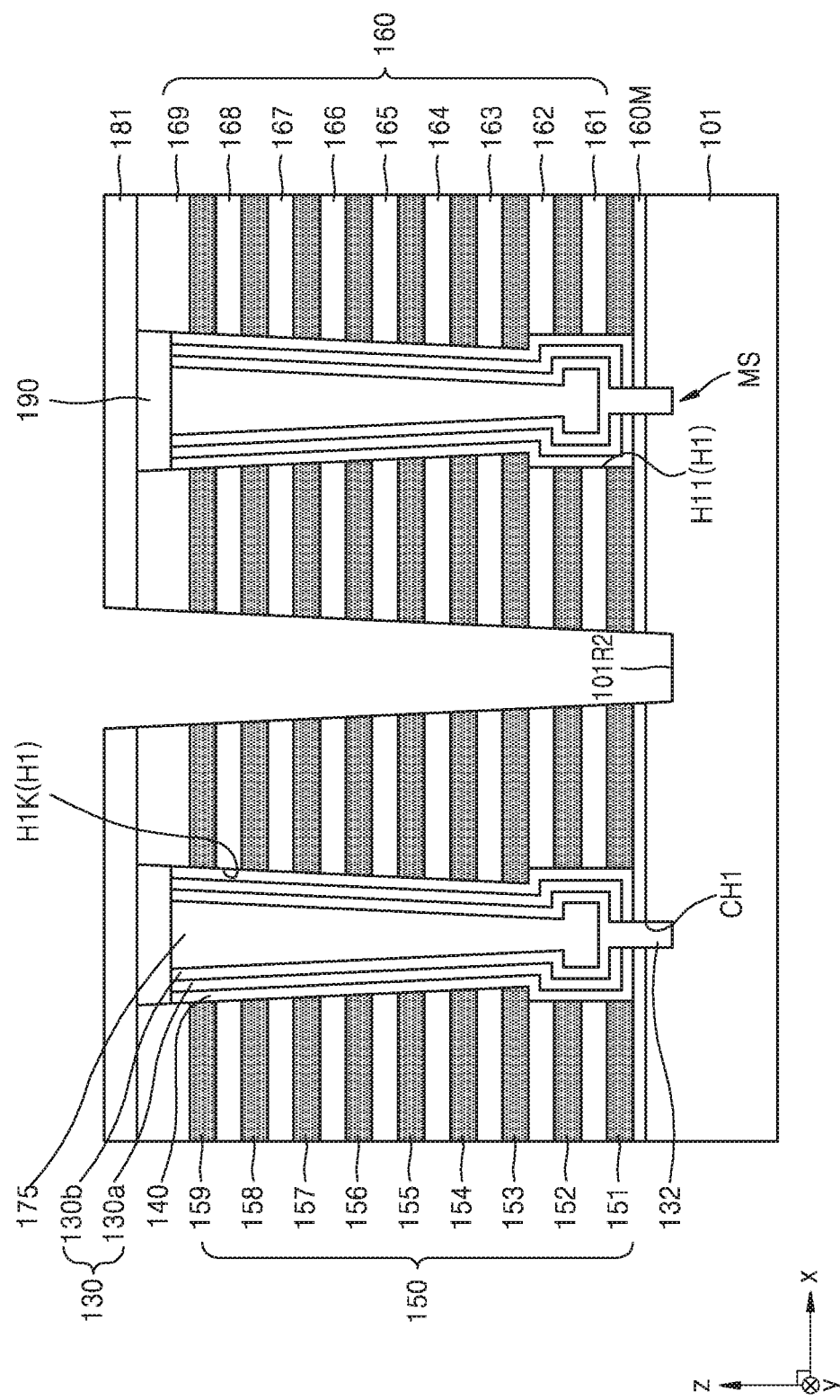
Figure 9Q:
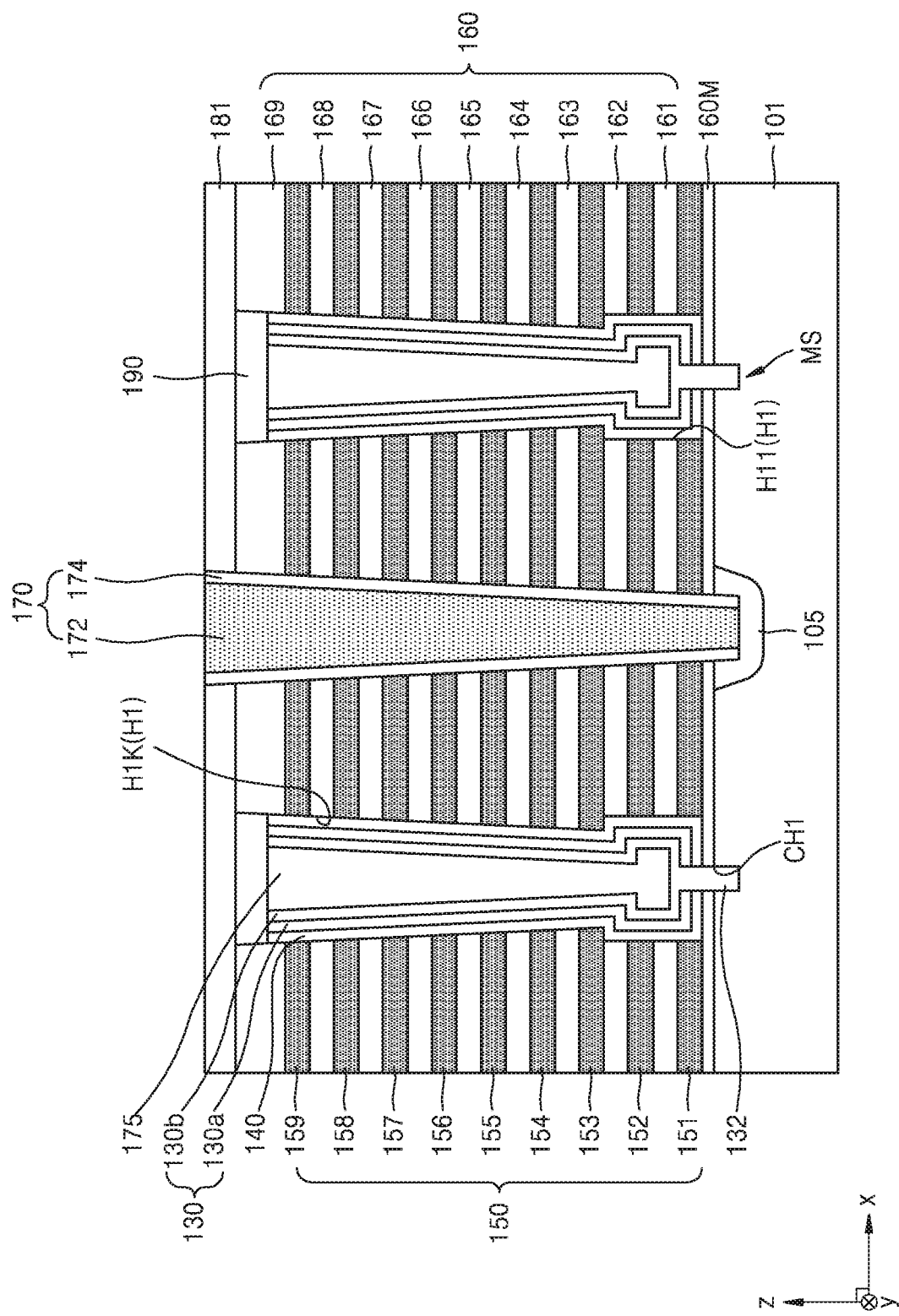

FIGS. 9A to 9Q are cross-sectional views in a sequence of steps in a method of manufacturing the non-volatile memory device 100, according to the inventive concept.

Referring to FIG. 9A, the lower insulating layer 160M is formed on the substrate 101, and at least one sacrificial layer 111 and 112 for forming a first structure and at least one interlayer insulating layers 161 and 162 may be alternately stacked. The sacrificial layers 111 and 112 and the interlayer insulating layers 161 and 162 may alternately stacked on the substrate 101 from the lower insulating layer 160M, as illustrated.

The sacrificial layers 111 and 112 may include a material having an etch selectivity to the interlayer insulating layers 161 and 162. For example, the sacrificial layers 111 and 112 may be etched at an etch rate higher than that at which the interlayer insulating layers 161 and 162 are etched, by a certain etchant. That is, the sacrificial layers 111 and 112 may include a material that may be etched by minimally etching the interlayer insulating layers 161 and 162 using the certain etchant. For example, the interlayer insulating layers 161 and 162 may be at least one of a silicon oxide layer and a silicon nitride layer, and the sacrificial layers 111 and 112 may be selected from among a silicon layer, a silicon oxide layer, a silicon carbide layer, and a silicon nitride layer and may include a different material having an etch selectivity to the interlayer insulating layers 161 and 162.

Referring to FIG. 9B, a first etching process may be formed to form the first open region H11 that extends through the sacrificial layers 111 and 112 and the interlayer insulating layers 161 and 162 which are alternately stacked and expose an upper surface 160MT of the lower insulating layer 160M. In this case, the first open region H11 may have the uniform first width H1W, but the inventive concept is not limited thereto. The side profile of the first open region H11 has a certain gradient, and thus the first width H1W may slightly differ according to heights.

The first etching process may be an anisotropic etching process. For example, the first etching process may be any one of physical etching such as sputter etching, chemical etching such as reactive radical etching, and physicochemical etching such as reactive ion etching (RIE), magnetically enhanced RIE (MERLE), transformer coupled plasma (TCP) etching, or inductively coupled plasma (ICP).

More specifically, the first etching process may be performed by forming a certain mask pattern (not shown) to define a location of the first open region H11 on the sacrificial layers 111 and 112 and the interlayer insulating layers 161 and 162, which are alternately stacked, and by using an etchant for etching the sacrificial layers 111 and 112 and the interlayer insulating layers 161 and 162 and while using the mask pattern as an etch mask.

Referring to FIG. 9C, a second sacrificial 121 that fills the first open region H11 may be formed on the sacrificial layers 111 and 112 and the interlayer insulating layers 161 and 162. The second sacrificial 121 may have an etch selectivity to the interlayer insulating layers 161 and 162 and may include a material having an etch selectivity to the sacrificial layers 111 and 112. For example, the second sacrificial 121 may have an etch rate lower than etch rates of the sacrificial layers 111 and 112 and the interlayer insulating layers 161 and 162 when using a first etchant and may include a material having an etch rate higher than the etch rates of the sacrificial layers 111 and 112 and the interlayer insulating layers 161 and 162 when using a second etchant. More specifically, when the sacrificial layers 111 and 112 or the interlayer insulating layers 161 and 162 are etched by the first etchant, the second sacrificial 121 is minimally etched, and when the second sacrificial 121 is etched by the second etchant, the sacrificial layers 111 and 112 and the interlayer insulating layers 161 and 162 may be minimally etched. In some examples of the inventive concept, the second sacrificial 121 may include polysilicon.

Referring to FIG. 9D, a planarization process, e.g., Chemical Mechanical Polishing (CMP) or an etch-back process, may be performed so that only the second sacrificial 121 of FIG. 9C remains in the first open region H11. An upper surface of the interlayer insulating layer 162 may be exposed by the planarization process.

The second sacrificial 121 of FIG. 9C that fills the first open region H11 may function as the etch stop structure 122.

Referring to FIG. 9E, depending on the number of gate electrodes necessary in the final device, first sacrificial layers 113 to 119 and interlayer insulating layers 163 to 169 may be alternately stacked on the etch stop structure 122 and the interlayer insulating layers 161 and 162.

Then, a second etching process of forming a posterior open region H1K may be performed. The posterior open region H1K extends through the first sacrificial layers 113 to 119 and the interlayer insulating layers 163 to 169 which are alternately stacked and exposes an upper surface 122R of the etch stop structure 122. The etch stop structure 122 may prevent the substrate 101 from being exposed and dispersion of contact holes during the second etching process. A width H3W of an uppermost portion of the posterior open region H1K may be equal to or greater than the first width H1W of the first open region H11. The second width H2W of the posterior open region H1K may be less than the first width H1W of the first open region H11 at a boundary between the posterior open region H1K and the first open region H11.

In particular, the second etching process may be performed by forming a certain mask pattern (not shown) that defines a location of the posterior open region H1K on the first sacrificial layers 113 to 119 and the interlayer insulating layers 163 to 169, which are alternately stacked, and by using an etchant for etching the first sacrificial layers 113 to 119 and the interlayer insulating layers 163 to 169 while using the mask pattern as an etch mask.

The posterior open region H1K is identical to the second and third open regions H12 and H13 described with reference to FIGS. 2A to 4 and is referred to as the posterior open region H1K for convenience in describing the method of manufacturing a non-volatile memory device.

Referring to FIG. 9F, the etch stop structure 122 exposed through the posterior open region H1K may be removed. Accordingly, the opening H1 including the first open region H11 and the posterior open region H1K may be formed. An upper surface of the lower insulating layer 160M may be exposed through the opening H1.

Referring to FIG. 9G, the gate dielectric layer 140 may be formed evenly along the surfaces delimiting the sides and bottom of the opening H1. As described with reference to FIG. 3, the gate dielectric layer 140 may include the blocking insulating layer (146 of FIG. 4), the charge storage layer (144 of FIG. 4), and the tunneling insulating layer (142 of FIG. 4). In some examples of the inventive concept, each of the blocking insulating layer, the charge storage layer, and the tunneling insulating layer may be formed by, for example, CVD, Physical Vapor Deposition (PVD), Metal Organic CVD (MOCVD), Atomic Layer Deposition (ALD), Metal Organic ALD (MOALD), or the like. However, the inventive concept is not limited thereto.

Referring to FIG. 9H, the first channel layer 130a may be formed on the gate dielectric layer 140. The first channel layer 130a may include a semiconductor material such as polysilicon or monocrystalline silicon. The semiconductor material may not be doped with impurities or may include p-type or n-type impurities. In some examples of the inventive concept, the first channel layer 130a may be formed by ALD, CVD, or the like.

Referring to FIG. 9I, a spacer layer 135 may be formed on the first channel layer 130a. In some examples of the inventive concept, the spacer layer 135 may be, for example, a silicon oxide layer or a silicon nitride layer or may be formed by ALD or CVD. The spacer layer 135 may be used as a mask for etching lower surfaces of the first channel layer 130a and the gate dielectric layer 140 and may prevent the first channel layer 130a from being damaged during the etching process.

In the figures, the spacer layer 135 is shown as covering the entire first channel layer 130a. However, the inventive concept is not limited thereto. For example, unlike the illustration of FIG. 9I, the spacer layer 135 may cover only side surfaces of the first channel layer 130a.

Referring to FIG. 9J, the first channel layer 130a, the gate dielectric layer 140, and the lower surface of the lower insulating layer 160M may be anisotropically etched using the spacer layer 135 as a mask. The contact hole CH1 that exposes the substrate 101 may be formed by the anisotropic etching process. During the anisotropic etching process, the substrate 101 may be over-etched and thus recessed to a certain depth. As the substrate 101 is recessed, a contact area where the second channel layer (130b of FIG. 9K), which fills the recessed portion of the substrate 101, contacts the substrate 101 increases during a subsequent process, and thus, a channel resistance may decrease.

Referring to FIG. 9K, the spacer layer 135 that remains on side walls of the first channel layer 130a may be removed. The spacer layer 135 of FIG. 9J may be removed by, for example, a wet cleaning process. The wet cleaning process may be performed by using, for example, fluorine and a solution of a mixture of ammonia and hydrogen peroxide. The spacer layer 135 may be removed by a separate process or a cleaning process performed before the second channel layer 130b is formed.

Referring to FIG. 9L, the second channel layer 130b may be formed on the first channel layer 130a that is exposed by removing the spacer layer 135. The first channel layer 130a and the second channel layer 130b may together constitute the channel structure 130. The contact hole CH1 may be filled with the second channel layer 130b, and accordingly the channel structure 130 may include the contact portion 132. The channel structure 130 may be electrically connected to the substrate 101 through the contact portion 132. The second channel layer 130b may include the same material as the first channel layer 130a and may include, for example, a semiconductor material such as polysilicon or monocrystalline silicon.

Referring to FIG. 9M, the opening H1, which remains after the channel structure 130 is formed, may be filled by the buried insulating layer 175. Selectively, before the buried insulating layer 175 is formed, a hydrogen annealing process of thermally treating a structure to form a channel structure 130 in a gas atmosphere including hydrogen or heavy hydrogen may be further performed. Most of crystal defects occurring in the channel structure 130 may be cured in the hydrogen annealing process. In this case, the first and second voids V1 and V2 may be respectively formed in the first open region H11 and the posterior open region H1K of the buried insulating layer 175. However, the inventive concept is not limited thereto. Thus, the second void V2 may not be formed, depending on a manufacturing tolerance.

Then, to remove a semiconductor material, an insulating material, etc., which unnecessarily cover the interlayer insulating layer 169 that is the uppermost among the interlayer insulating layers 161 to 169, a planarization process, e.g., CMP or an etch-back process, may be performed until an upper surface of the interlayer insulating layer 169 is exposed.

Furthermore, the conductive layer 190 may be formed to cover an upper surface of each of the channel structure 130, the gate dielectric layer 140, and the buried insulating layer 175. In some examples of the inventive concept, after forming the third opening portion H13, the conductive layer 190 may be buried in the third opening portion H13. In some examples of the inventive concept, the conductive layer 190 may include polysilicon doped with n-type impurities, e.g., P, As, or Sb. Accordingly, the memory cell strings MS may be formed.

Referring to 9N, the upper insulating layer 181 may be formed to cover an upper surface of the conductive layer 190 and the upper surface of the interlayer insulating layer 169. The upper insulating layer 181 may protect the conductive layer 190 from damage, contamination, or the like, which may occur during subsequent processes.

An opening HC exposing the substrate 101 may be formed between the memory cell strings MS by anisotropically etching the upper insulating layer 181, the interlayer insulating layers 160, and second sacrificial layers 110.

Referring to FIG. 9O, the second sacrificial layers 110 shown in FIG. 9N which are exposed through the opening HC are removed, and side openings HCS defined between the interlayer insulating layers 160 may be formed. The second sacrificial layers 110 may be removed by, for example, a full-back etching process. Some side portions of the gate dielectric layer 140 may be exposed through the side openings HCS.

The side openings HCS may be formed by horizontally etching the second sacrificial layers 110 with an etchant that hardly etches the interlayer insulating layers 160. The etching process may be, for example, a wet etching process, a chemically dry etching process, a dry vapor etching process, or the like. The etching process may be an isotropic etching process.

Referring to FIG. 9P, the side openings HCS of FIG. 9O may be filled with a conductive material (not shown). The conductive material may be metal, e.g., W. After the side openings HCS are filled by the conductive material, the conductive material in the opening HC may be removed such that only the conductive material in the side openings HCS of FIG. 9O remains.

Referring to FIG. 9Q, impurities are injected into the substrate 101 through the opening HC of FIG. 9P, thereby forming the impurity region 105.

Then, after an insulating layer is formed along the opening HC and the upper surface of the upper insulating layer 181, the common source line spacer 174 may be formed by performing the anisotropic etching process. The impurity region 105 formed on the substrate 101 may be exposed by performing the etching process.

A conductive layer (not shown) including W, Ta, Co, tungsten silicide, tantalum silicide, cobalt silicide, or the like is formed in the opening HC in which the common source line spacer 174 is formed, and then a planarization process is performed on the conductive layer until the upper surface of the upper insulating layer 181 is exposed, thereby forming the common source line 172.

Referring back to FIG. 2B, the common source line buried insulating layer 183 covering the common source line structure 170 and the upper insulating layer 181 is formed. Also, the bit line contact plug 195 may be formed. The bit line contact plug 195 may extend through the common source line buried insulating layer 183 and the upper insulating layer 181 by performing a photolithography process and an etching process and thus contact the conductive layer 190. The bit line 193 connected to the bit line contact plug 195 may be formed on the common source line buried insulating layer 183. Accordingly, the non-volatile memory device 100 described with reference to FIGS. 2A to 4 may be manufactured.

Figure 10A:
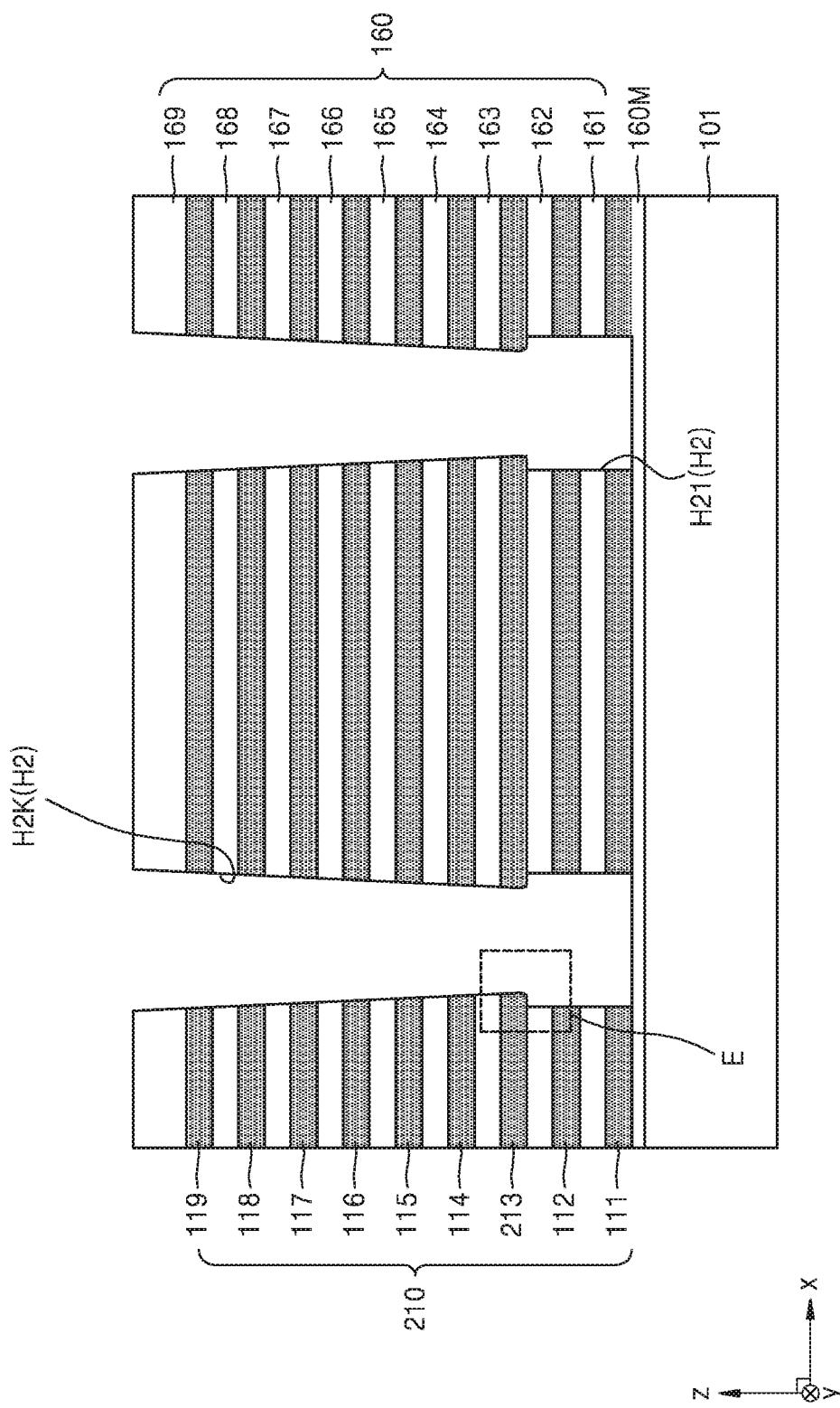
FIG. 10A is a cross-sectional view of a non-volatile memory device during the course of its manufacture and shows some processes in a method of manufacturing a non-volatile memory device, according to other the inventive concept.
Figure 10B:
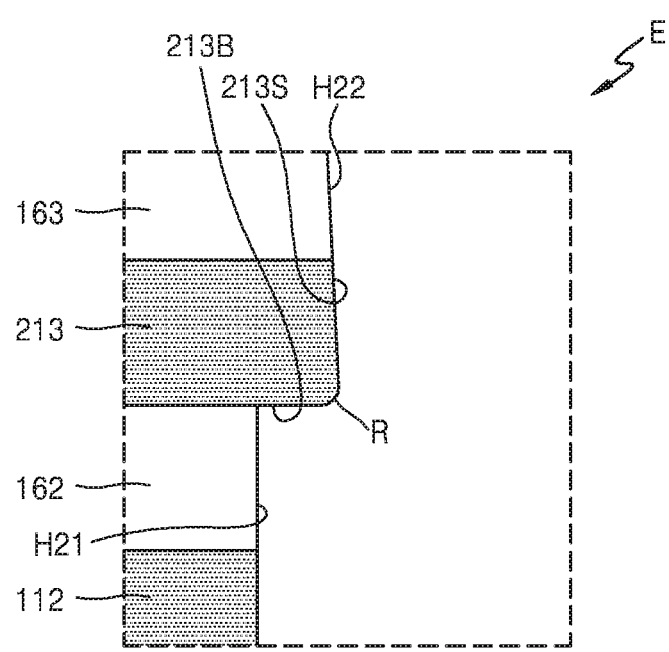
FIG. 10B is a diagram showing an enlarged portion E of FIG. 10A.

FIG. 10A is a cross-sectional view showing some processes in a method of manufacturing the non-volatile memory device 200, according to another example of the inventive concept. FIG. 10B is a diagram showing an enlarged portion E of FIG. 10A. The method of manufacturing the non-volatile memory device 200 is similar to the method described with reference to FIGS. 9A to 9Q. However, as described with reference to FIG. 9F, as the etching process of etching the posterior open region H1K in the first open region H21 proceeds, a lower surface 213B of a sacrificial layer 213 exposed by the first open region H21 may be exposed due to the penetration of etchant from a portion of the lower surface 213B that is adjacent to a side surface 213S thereof. Accordingly, a corner along which the lower surface 213B and the side surface 213S of the sacrificial layer 213 meet may be etched to become round.

The non-volatile memory device 200 described with reference to FIGS. 5 and 6 may be manufactured by identically performing the subsequent processes of FIGS. 9G to 9Q.

FIGS. 11A to 11D are cross-sectional views of some processes for describing a method of manufacturing the non-volatile memory device 300, according to another example of the inventive concept. The method of manufacturing the non-volatile memory device 300 is similar to the method describe with reference to FIGS. 9A to 9Q. Referring to FIGS. 9K to 11A, after the contact hole CH3 exposing the substrate 101 is formed, an etching process of additionally etching lower side walls of the gate insulating layer 340, a first channel layer 330a, and a spacer layer 335 may be performed. The additional etching process may be an isotropic etching process. Accordingly, an inner surface of the gate dielectric layer 340 may be concave in a lateral direction.

Figure 11A:
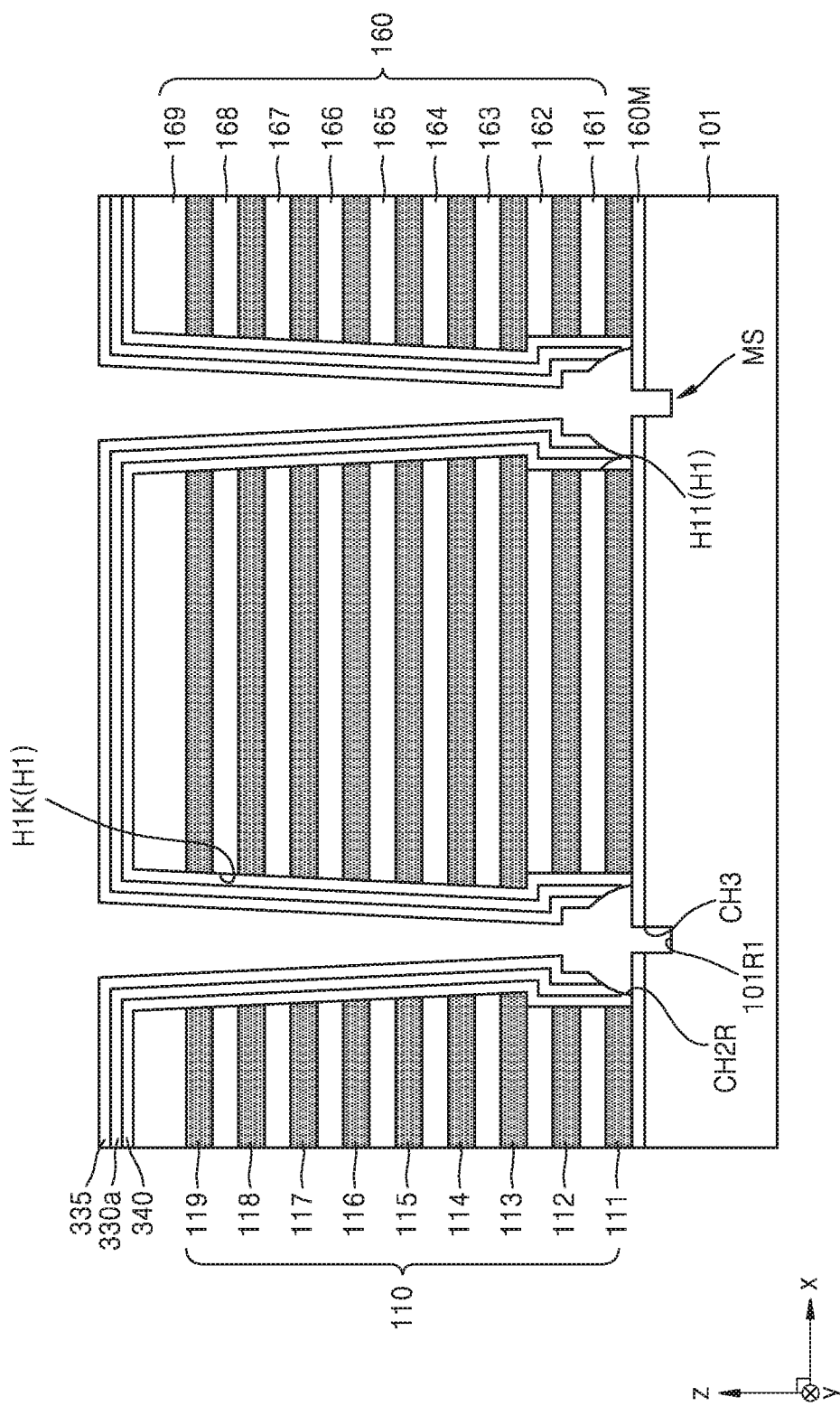
FIGS. 11A, 11B, 11C, and 11D are cross-sectional views of a non-volatile memory device during the course of its manufacture and show a sequence of steps in a method of manufacturing a non-volatile memory device according to other the inventive concept.
Figure 11B:
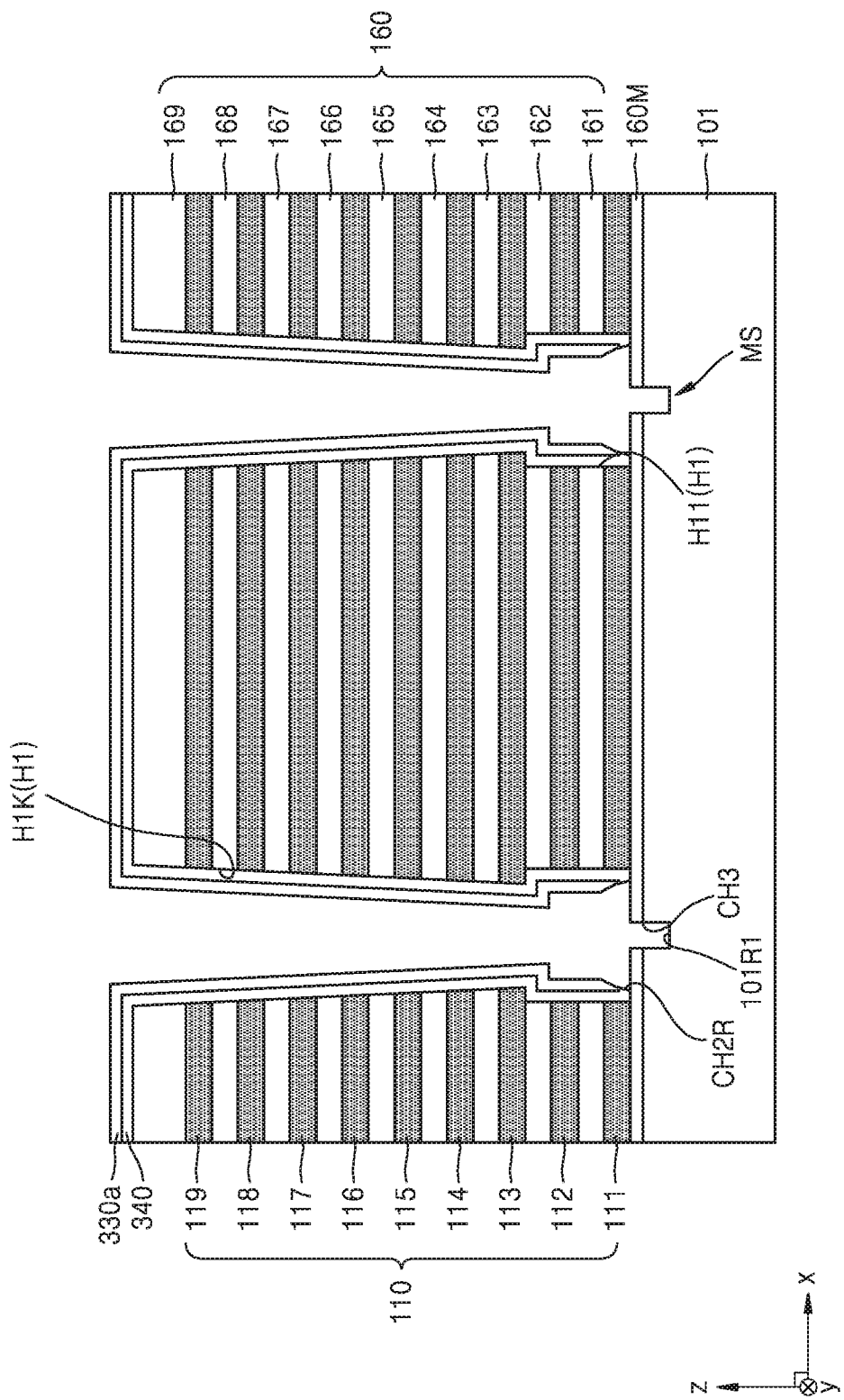

Referring to FIG. 11B, the spacer layer 335 of FIG. 11A that remains on a side wall of the first channel layer 330a may be removed. The spacer layer 335 may be removed by, for example, a wet cleaning process.

Figure 11C:
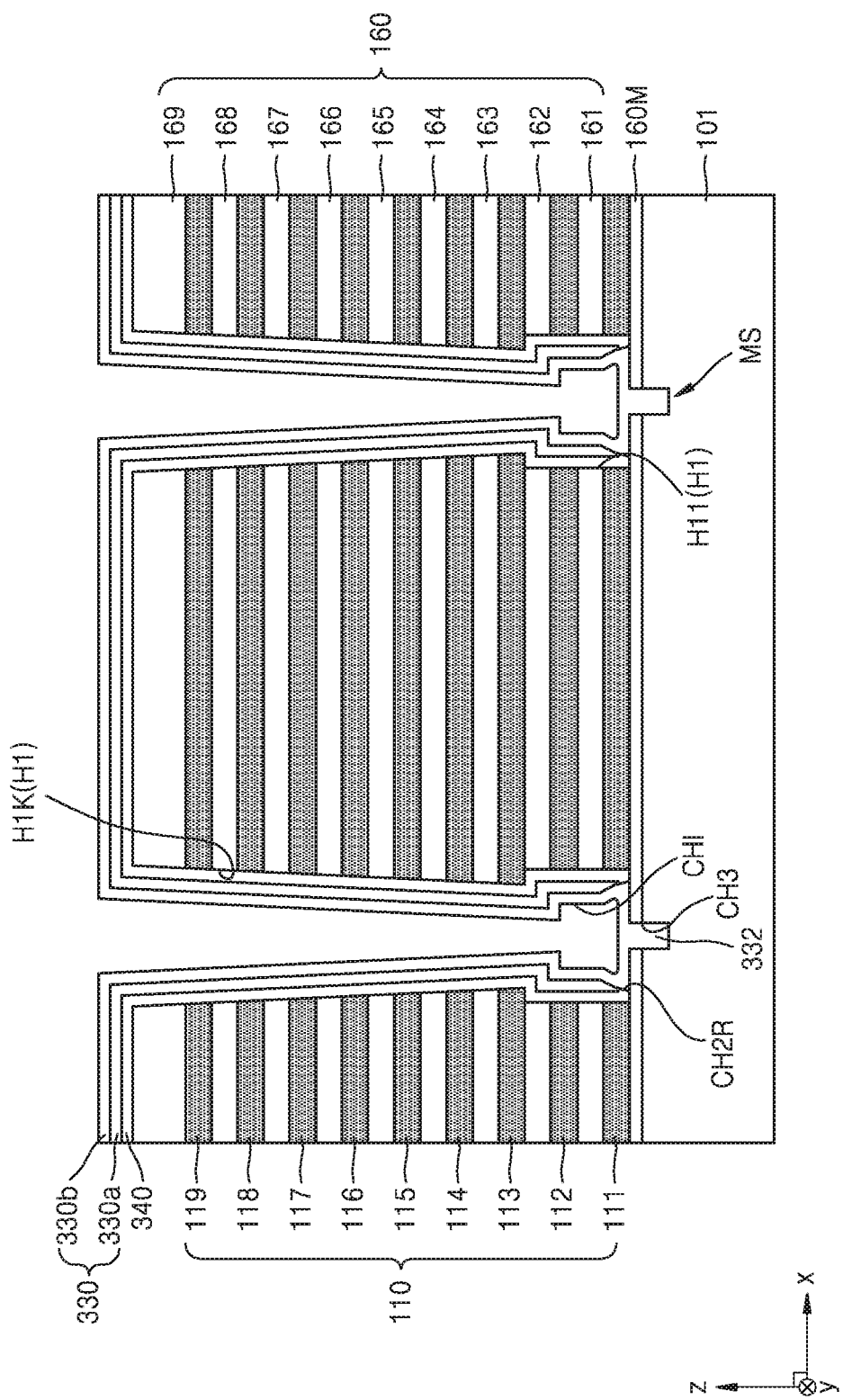

Referring to FIG. 11C, a second channel layer 330b may be formed on the first channel layer 330a that is exposed by removing the spacer layer 335. In this case, an inner surface of the second channel layer 330b may have a bulb shape of which a lower portion is wider than an upper portion.

Figure 11D:
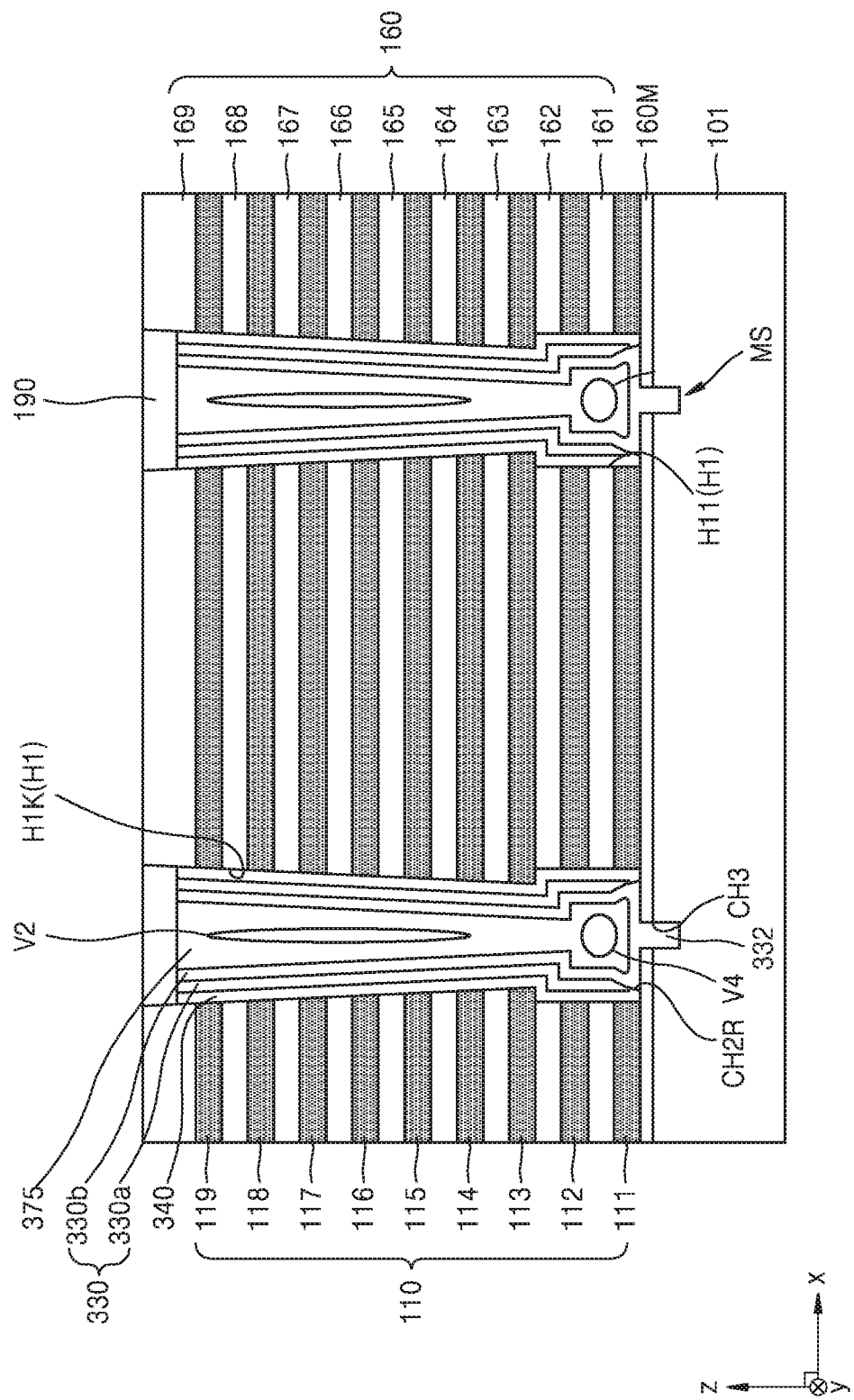

Referring to FIG. 11D, the opening H3, which remains after the channel structure 330 is formed, may be filled by a buried insulating layer 375. In this case, a first void V4 and the second void V2 may be respectively formed in the first open region H11 and the posterior open region H1K in the buried insulating layer 375. However, the inventive concept is not limited thereto. The second void V2 may not be formed, depending on a manufacturing tolerance.

The non-volatile memory device 300 described with reference to FIGS. 7 and 8 may be manufactured by identically performing the subsequent processes of FIGS. 9N to 9Q.

Although the inventive concept has been particularly shown and described with reference to examples thereof, it will be understood that various changes in form and details may be made to such examples without departing from the spirit and scope of the inventive concept as set forth in the following claims.

What is claimed is:

1. A non-volatile memory device comprising:
a substrate;
a lower insulating layer disposed on the substrate;
a multilayer structure of layers comprising gate electrodes and interlayer insulating layers alternately stacked on the lower insulating layer, the multilayer structure having an opening extending vertically from the lower insulating layer, the opening including a first open portion and a second open portion,
wherein the first open portion extends through at least one of the layers of the multilayer structure from the lower insulating layer, and the second open portion is located on the first open portion and extends vertically upwardly from the first open portion in the multilayer structure, and the opening has a first width at the first open portion and a second width at the second open portion, the second width being less than the first width;
a gate dielectric extending along an inner surface and a lower surface defining a side and a bottom of the opening, respectively, wherein the gate dielectric is located on the lower insulating layer; and
a channel structure disposed on the gate dielectric within the opening as extending along the inner surface and the lower surface defining the side and the bottom of the opening, the channel structure extending through the lower insulating layer and the gate dielectric and electrically connected to the substrate,
wherein a lower surface of the gate dielectric contacts an upper surface of the lower insulating layer in the bottom of the opening.

2. The non-volatile memory device of claim 1, wherein a side surface of the gate dielectric contacts a side surface of the channel structure in the first open portion.

3. The non-volatile memory device of claim 1, wherein a distance between inner surfaces of the gate dielectric in the first open portion is greater than a distance between the inner surfaces of the gate dielectric layer in the second open portion.

4. The non-volatile memory device of claim 1, wherein the channel structure includes a first channel layer on the gate dielectric layer and a second channel layer electrically connected to the substrate on the first channel layer.

5. The non-volatile memory device of claim 4, wherein the second channel layer includes a contact portion that extends through the first channel layer.

6. The non-volatile memory device of claim 1, wherein a distance between inner surfaces of the channel structure in the first open portion is greater than a distance between the inner surfaces of the channel structure in the second open portion.

7. The non-volatile memory device of claim 1, wherein the channel structure in the first open portion has a first region adjacent to the lower insulating layer, and a second region on the first region, and an inner surface of the first region is concave in a lateral direction.

8. The non-volatile memory device of claim 1, wherein the first open portion has a first height, the second open portion has a second height, the first height with respect to the first width is less than or equal to 1, and the second height with respect to the second width is equal to or greater than 1.

9. The non-volatile memory device of claim 1, further comprising a buried insulating layer disposed on the channel structure within the opening.

10. A non-volatile memory device comprising:
a substrate;
a lower insulating layer disposed on the substrate;
a multilayer structure of layers comprising gate electrodes and interlayer insulating layers alternately stacked on the lower insulating layer, the multilayer structure having an opening extending vertically from the lower insulating layer, the opening including a first open portion and a second open portion,
wherein the first open portion extends through at least one of the layers of the multilayer structure from the lower insulating layer, and the second open portion is located on the first open portion and extends vertically upwardly from the first open portion in the multilayer structure, and the opening has a first width at the first open portion and a second width at the second open portion, the second width being less than the first width;
a gate dielectric extending along an inner surface and a lower surface defining a side and a bottom of the opening, respectively; and
a channel structure disposed on the gate dielectric within the opening as extending along the inner surface and the lower surface defining the side and the bottom of the opening, the channel structure extending through the lower insulating layer and electrically connected to the substrate,
wherein the channel structure includes a first channel layer on the gate dielectric and a second channel layer electrically connected to the substrate on the first channel layer,
wherein a distance from a bottom surface of the gate dielectric to an upper surface of the substrate is smaller than a distance between an upper surface of the second channel layer and an upper surface of the lower insulating layer in the first open portion, and
wherein a lower surface of the gate dielectric contacts an upper surface of the lower insulating layer in the bottom of the opening.

11. The non-volatile memory device of claim 10, wherein a thickness of the first channel layer and the second channel layer on the lower insulating layer is larger than a thickness of the lower insulating layer on the substrate.

12. The non-volatile memory device of claim 10, wherein a side surface of the gate dielectric contacts a side surface of the second channel structure layer in the first open portion.

13. The non-volatile memory device of claim 10, further comprising a buried insulating layer disposed on the channel structure within the opening, wherein the buried insulating layer has a void therein, the void being located within the first open portion or the second open portion of the opening.

14. A non-volatile memory device comprising:
a substrate;
a lower insulating layer disposed on the substrate;
a multi-layered structure on the lower insulating layer, the multi-layered structure including a first structure and a second structure, wherein the multi-layered structure has an opening extending therein, the opening includes a first open portion extending through the first structure, and a second open portion extending through the second structure, the opening has a first width at the first open portion and a second width at the second open portion, the second width is less than the first width;

a gate dielectric layer extending along an inner surface and a lower surface defining a side and a bottom of the opening, respectively; and a channel structure disposed on the gate dielectric layer and on the inner surface and the lower surface defining the side and the bottom of the opening, and the channel structure extending through the lower insulating layer and electrically connected to the substrate, wherein the lower insulating layer and the gate dielectric layer contact a side surface of the channel structure.

15. The non-volatile memory device of claim 14, wherein the channel structure includes a first channel layer on the gate dielectric layer extending along the inner surface defining the side of the opening, and a second channel layer on the first channel layer, the second channel layer electrically connected to the substrate.

16. The non-volatile memory device of claim 15, wherein the second channel layer extends through the lower insulating layer and into the substrate.

17. The non-volatile memory device of claim 14, wherein the first open portion has a first height, the second open portion has a second height, the first height with respect to the first width is less than or equal to 1, and the second height with respect to the second width is equal to or greater than 1.

18. The non-volatile memory device of claim 14, further comprising a buried insulating layer disposed on the channel structure within the opening.

19. The non-volatile memory device of claim 14, wherein a distance between inner surfaces of the channel structure in the first open portion is greater than a distance between the inner surfaces of the channel structure in the second open portion.

* * * * *